US010606355B1

(12) United States Patent
Zhang et al.

(10) Patent No.: US 10,606,355 B1
(45) Date of Patent: Mar. 31, 2020

(54) HAPTIC ARCHITECTURE IN A PORTABLE ELECTRONIC DEVICE

(71) Applicant: Apple Inc., Cupertino, CA (US)

(72) Inventors: Yaocheng Zhang, Cupertino, CA (US); Kevin M. Froese, San Francisco, CA (US); Benjamin J. Pope, Mountain View, CA (US); Scott A. Myers, Saratoga, CA (US)

(73) Assignee: APPLE INC., Cupertino, CA (US)

( * ) Notice: Subject to any disclaimer, the term of this patent is extended or adjusted under 35 U.S.C. 154(b) by 101 days.

(21) Appl. No.: 15/691,483

(22) Filed: Aug. 30, 2017

Related U.S. Application Data

(60) Provisional application No. 62/383,978, filed on Sep. 6, 2016.

(51) Int. Cl.
| | | |
|---|---|---|
| *G06F 3/01* | (2006.01) | |
| *G06F 3/041* | (2006.01) | |
| *G06F 3/044* | (2006.01) | |
| *G06F 3/046* | (2006.01) | |
| *H01F 7/06* | (2006.01) | |
| *H01F 7/20* | (2006.01) | |

(52) U.S. Cl.
CPC ............. *G06F 3/016* (2013.01); *G06F 3/046* (2013.01); *G06F 3/0416* (2013.01); *H01F 7/064* (2013.01); *H01F 7/20* (2013.01); *G06F 3/044* (2013.01)

(58) Field of Classification Search
CPC .......... G06F 3/041; G06F 3/016; G06F 3/044; G08B 6/00
See application file for complete search history.

(56) References Cited

U.S. PATENT DOCUMENTS

| | | | |
|---|---|---|---|
| 8,135,149 B2 | 3/2012 | Yoshida et al. | |
| 9,461,605 B2 | 10/2016 | Sekiyama | |
| 9,474,683 B1* | 10/2016 | Mortimer | ........... A61H 23/0263 |
| 9,513,709 B2 | 12/2016 | Gregorio et al. | |
| 9,552,066 B2* | 1/2017 | Taninaka | ............... B06B 1/0246 |
| 9,600,071 B2* | 3/2017 | Rothkopf | ................ G06F 3/016 |
| 9,742,254 B1* | 8/2017 | Choi | ...................... H02K 33/00 |
| 10,069,392 B2 | 9/2018 | Degner et al. | |
| 10,209,123 B2 | 2/2019 | Vitt et al. | |

(Continued)

FOREIGN PATENT DOCUMENTS

JP         2011188191 A        9/2011

*Primary Examiner* — William Lu
(74) *Attorney, Agent, or Firm* — Dorsey & Whitney LLP

(57) ABSTRACT

According to some embodiments, an electronic device can include a processor and a haptic feedback system. The haptic feedback system can include a mass that is coupled to a magnetic element and variable magnetic elements capable of establishing a magnetic field in communication with the magnetic element that varies in accordance with the processor receiving a signal that indicates that a touch event is detected at a touch sensitive layer, where the magnetic field causes displacement of the magnetic element. The haptic feedback system can further include a magnetic field sensor in communication with the processor, where the magnetic field sensor is capable of (i) detecting a change in the magnetic field that is induced by the displacement of the magnetic element, and (ii) providing a detection signal to the processor that corresponds to a current position of the mass that is coupled to the magnetic element.

17 Claims, 13 Drawing Sheets

(56) References Cited

U.S. PATENT DOCUMENTS

| | | | |
|---|---|---|---|
| 10,310,603 B2* | 6/2019 | Vanhelle | B60K 37/06 |
| 2012/0223880 A1* | 9/2012 | Birnbaum | G06F 3/015 |
| | | | 345/156 |
| 2012/0232780 A1* | 9/2012 | Delson | A63F 13/06 |
| | | | 701/400 |
| 2012/0249462 A1* | 10/2012 | Flanagan | G06F 1/1694 |
| | | | 345/173 |
| 2014/0167941 A1* | 6/2014 | Rank | G08B 6/00 |
| | | | 340/407.1 |
| 2015/0220148 A1* | 8/2015 | Gregorio | G06F 3/016 |
| | | | 340/407.2 |
| 2015/0301673 A1* | 10/2015 | Peshkin | G06F 3/016 |
| | | | 345/174 |
| 2016/0144404 A1* | 5/2016 | Houston | B06B 1/166 |
| | | | 318/114 |
| 2016/0248310 A1* | 8/2016 | Elenga | H02K 33/16 |
| 2017/0070131 A1 | 3/2017 | Degner et al. | |
| 2017/0085165 A1 | 3/2017 | Hajati et al. | |
| 2017/0090574 A1* | 3/2017 | Baer | G06F 3/016 |
| 2017/0285848 A1* | 10/2017 | Rosenberg | G06F 3/016 |
| 2018/0084324 A1 | 3/2018 | Vitt et al. | |
| 2018/0166235 A1* | 6/2018 | Merminod | G06F 3/04847 |
| 2018/0281020 A1 | 10/2018 | Katada et al. | |
| 2018/0301969 A1 | 10/2018 | Takahashi et al. | |
| 2018/0367019 A1 | 12/2018 | Takahashi et al. | |

* cited by examiner

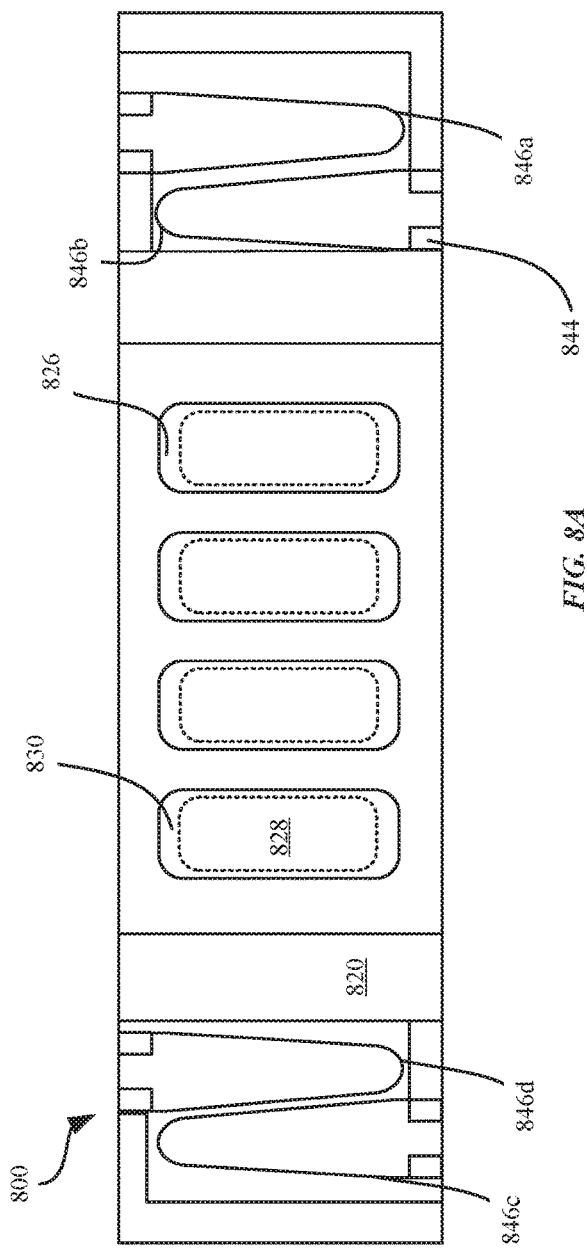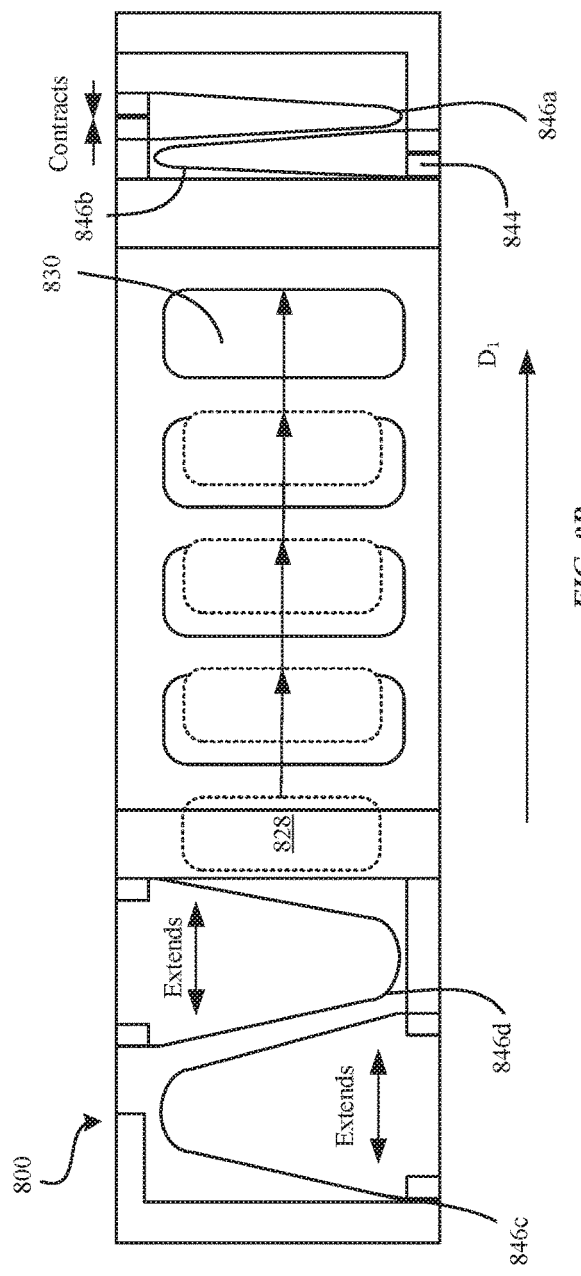
FIG. 8A
FIG. 8B

HAPTIC ARCHITECTURE IN A PORTABLE ELECTRONIC DEVICE

CROSS-REFERENCE TO RELATED APPLICATIONS

The present application claims the benefit of U.S. Provisional Application No. 62/383,978, entitled "HAPTIC ARCHITECTURE IN A PORTABLE ELECTRONIC DEVICE," filed Sep. 6, 2016, the content of which is incorporated herein by reference in its entirety for all purposes.

FIELD

The described embodiments relate generally to executing a haptic feedback event at a feedback system of a portable electronic device. More particularly, the described embodiments involve determining a position of a movable mass of the feedback system in conjunction with executing the haptic feedback event, and subsequently executing another haptic feedback event based on the position of the movable mass.

BACKGROUND

Conventional portable electronic devices can include feedback components for executing haptic feedback in conjunction with providing a notification to a user. However, the haptic feedback that is executed does not generally reflect a current state of the feedback component. For example, as components (e.g., springs) of the feedback component degrade over time, the feedback component is unable to execute haptic feedback that compensates for such degradations. Consequently, the portable electronic device is unable to execute an optimal level of haptic feedback that can be perceived by the user.

SUMMARY

To cure the foregoing deficiencies, the representative embodiments set forth herein disclose various techniques for enabling a feedback system of a portable electronic device to execute a haptic feedback event.

According to some embodiments, an electronic device for executing a haptic feedback event is described. The electronic device can include an enclosure having walls that define a cavity, where the enclosure is capable of carrying components that include a processor capable of providing instructions and a display assembly in communication with the processor, where the display assembly is overlaid by a touch sensitive layer. According to some embodiments, the enclosure can further carry a feedback system capable of executing the haptic feedback event. According to some embodiments, the feedback system can include a mass coupled to a magnetic element and variable magnetic elements capable of establishing a magnetic field in communication with the magnetic element that varies in accordance with instructions received from the processor in accordance with the processor receiving a signal that indicates that a touch event is detected at the touch sensitive layer, where the magnetic field causes displacement of the magnetic element. According to some embodiments, the feedback system can further include a magnetic field sensor in communication with the processor, wherein the magnetic field sensor is capable of (i) detecting a change in the magnetic field that is induced by the displacement of the magnetic element, and (ii) providing a detection signal to the processor that corresponds to a current position of the mass that is coupled to the magnetic element.

According to some embodiments, a method for executing multiple haptic feedback events at a feedback system of an electronic device is described. In some embodiments, the feedback system can include (i) a mass coupled to a magnetic element, and (ii) variable magnetic elements capable of generating a magnetic field. According to some embodiments, the method can include in response to receiving an initial request to execute a first haptic feedback event: executing the first haptic feedback event by causing the variable magnetic elements to generate the magnetic field that interacts with the magnetic element so as to displace the mass by a predetermined amount, where the magnetic field is based on conditions of the initial request. The method can further include while executing the first haptic feedback event and the mass is being displaced, receiving a subsequent request to execute a second haptic feedback event. The method can further include determining a position of the mass relative to the variable magnetic elements while the mass is being displaced, and generating a feedback parameter for the second haptic feedback event that is based on the position of the mass.

According to some embodiments, an electronic device for generating haptic feedback is described. The electronic device can include a housing having walls that define a cavity, where the housing is capable of carrying operational components within the cavity that can include a processor capable of providing instructions and a feedback system coupled to the processor, the feedback system having a retaining structure. According to some embodiments, the retaining structure can include a mass that is coupled to a magnetic element, the mass having a first end and a second end, and a first set of springs coupled to the first end of the mass, and a second set of springs coupled to the second end of the mass. According to some embodiments, the retaining structure can further include a variable magnetic element that is capable of generating a magnetic field when the processor receives a haptic feedback request, where the magnetic field causes the mass to displace along a longitudinal axis of the retaining structure while the first and second sets of springs prevent the mass from oscillating in a direction that is inconsistent with the longitudinal axis.

The described embodiments may be better understood by reference to the following description and the accompanying drawings. Additionally, advantages of the described embodiments may be better understood by reference to the following description and accompanying drawings.

BRIEF DESCRIPTION OF THE DRAWINGS

The disclosure will be readily understood by the following detailed description in conjunction with the accompanying drawings, wherein like reference numerals designate like structural elements, and in which:

FIGS. 8A-8B illustrate top views of a haptic feedback component that can be configured to implement different aspects of the various techniques described herein, in accordance with some embodiments.

Figure 1:
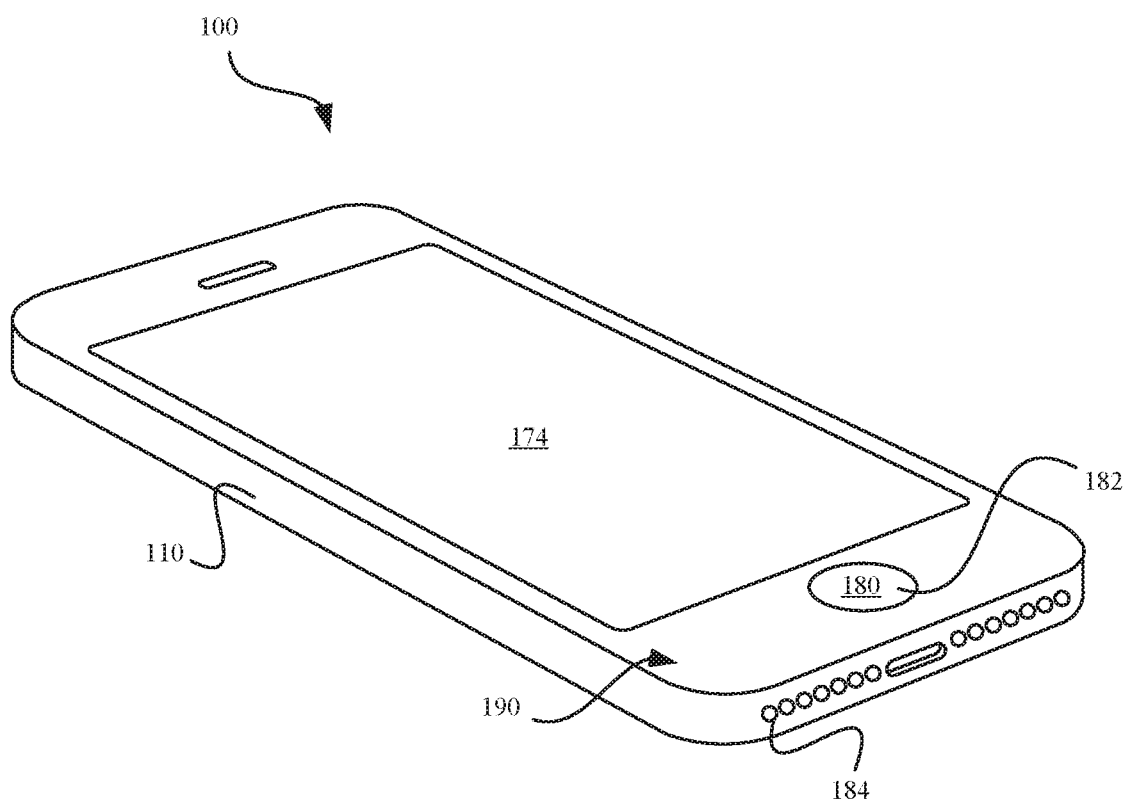
FIG. 1 illustrates a perspective view of a portable electronic device that can be configured to implement different aspects of the various techniques described herein, in accordance with some embodiments.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The embodiments described herein set forth techniques for enabling a portable electronic device to execute haptic feedback by utilizing a haptic feedback component, in conjunction with providing a notification to a user. In some examples, the haptic feedback component includes a movable mass that can be actuated via a magnetic field that is generated by the haptic feedback component. In particular, the actuation of the movable mass can transmit forces to a housing of the portable electronic device, which can, in turn, be perceived by the user. However, portable electronic devices are unable to execute multiple, overlapping haptic feedback events due to being unable to determine a position of the movable mass in conjunction with executing the haptic feedback.

Consider, for example, a scenario where the portable electronic device receives multiple requests to execute separate haptic feedback events, such as where a user of the portable electronic device initiates a first request to initiate an intelligent personal assistant and knowledge navigator that is established at the portable electronic device by depressing a switch. In turn, the portable electronic device can execute a first haptic feedback event in conjunction with initiating the intelligent personal assistant and knowledge navigator. Before the first haptic feedback event is complete, the portable electronic device receives a second request to provide a second haptic feedback in conjunction with the portable electronic device receiving a phone call from the user's friend. However, due to the aforementioned technical limitations, the portable electronic device is unable to interrupt the execution of the first haptic feedback event in order to notify the user with the second haptic feedback event. Accordingly, these portable electronic devices can utilize the techniques as described in greater detail herein to determine a position of the movable mass such as to provide the user with overlapping haptic feedback events.

According to some embodiments, an electronic device for executing a haptic feedback event is described. The electronic device can include an enclosure having walls that define a cavity, where the enclosure is capable of carrying components that include a processor capable of providing instructions and a display assembly in communication with the processor, where the display assembly is overlaid by a touch sensitive layer. According to some embodiments, the enclosure can further carry a feedback system capable of executing the haptic feedback event. According to some embodiments, the feedback system can include a mass coupled to a magnetic element and variable magnetic elements capable of establishing a magnetic field in communication with the magnetic element that varies in accordance with instructions received from the processor in accordance with the processor receiving a signal that indicates that a touch event is detected at the touch sensitive layer, where the magnetic field causes displacement of the magnetic element. According to some embodiments, the feedback system can further include a magnetic field sensor in communication with the processor, wherein the magnetic field sensor is capable of (i) detecting a change in the magnetic field that is induced by the displacement of the magnetic element, and (ii) providing a detection signal to the processor that corresponds to a current position of the mass.

According to some examples, the portable electronic device can refer to a smartphone, a smartwatch, a computer tablet, a portable computer, a consumer device, a fitness tracker, and so forth. A more detailed discussion of these techniques is set forth below and described in conjunction with FIGS. 1, 2A-2B, 3-7, 8A-8B, and 9-12, which illustrate detailed diagrams of systems and methods that can be used to implement these techniques.

FIG. 1 illustrates a perspective view of a portable electronic device 100 that is configured to generate haptic feedback, in accordance with some embodiments. In some embodiments, the portable electronic device 100 includes a display 174. The display 174 can refer to a touch-screen display that includes a plurality of capacitive sensors that are configured to detect a change in capacitance. In some embodiments, the portable electronic device 100 includes one or more haptic feedback components 190 that are configured to generate haptic feedback in conjunction with a user-initiated request or a device-initiated request. In some embodiments, the haptic feedback component 190 is configured to generate multiple haptic feedback events in conjunction with any combination of user-initiated and device-initiated requests. As described herein, the term haptic feedback (or haptic feedback event) can refer to simulating a sensation of touch by applying force, vibrations, or motions that can be perceived by a user. In some examples, the haptic feedback can stimulate nerves within the user's fingers/hands. As described herein, the terms "haptic" and "taptic" are interchangeably used herein.

In some embodiments, a first haptic feedback component 190 is primarily responsible for generating haptic feedback associated with user-initiated requests, while a secondary haptic feedback component (not illustrated) is responsible for generating haptic feedback associated with device-initiated requests.

In some embodiments, the user-initiated request to generate haptic feedback can be initiated by a user action. In some cases, the user action can include touching or pressing against a switch 180 that is carried by a cavity defined by a housing 110 of the portable electronic device 100. In some embodiments, the switch 180 is a solid-state switch or relay that is configured to detect a change in capacitance when a user's appendage comes into contact with an upper surface 182 of the switch 180. In some cases, the switch 180 does not include a mechanical actuator (e.g., spring) or other moving parts that can cause the switch 180 to depress into the housing 110. In other words, the switch 180 does not require moving parts in order to generate an electrical signal indicative of a change in capacitance. Instead the switch 180 can transmit an electrical signal (e.g., output voltage) that corresponds to the change in capacitance, whereupon the electrical signal is transmitted to a processor of the portable electronic device 100, as described in greater detail with reference to FIG. 9. The processor can be configured to generate a haptic feedback parameter based upon the electrical signal. In some embodiments, the portable electronic device 100 includes a A/D converter that is configured to convert the analog signal associated with the electrical signal into a digital signal. The electrical signal can be proportional to the detected change in capacitance.

In some examples, the switch 180 can be configured to generate a varying output voltage that is dependent upon at least one of the duration, pressure, or force, and the like that is applied by the user's appendage against the upper surface 182 of the switch 180. In this manner, different types of contact with the switch 180 can cause the processor to generate different types of haptic feedback. In some embodiments, the portable electronic device 100 includes a memory or storage device, as described in more detail with reference to FIG. 9, where the memory is configured to dynamically associate different types of contact with different types of haptic feedback to be generated. In one example, quickly touching the switch 180 can cause the haptic feedback component 190 to generate a short and quick burst of haptic feedback, which is associated with short frequency and high momentum. In another example, touching the switch 180 for a long duration of time can cause the haptic feedback component 190 to generate a long, prolonged burst of haptic feedback, which is associated with high frequency and low momentum.

In some embodiments, the switch 180 can include circuitry for use as a biometric sensor. For example, the switch 180 can be configured to function as a fingerprint reader. The switch 180 can utilize the capacitive changes that are detected from the user's appendage to identify the user's identity, whereupon the user's identity can be associated with the portable electronic device 100.

In another example, the user-initiated request can refer to the user speaking a voice command that is detected by a microphone of the portable electronic device 100 so as to cause an instruction to be executed. For example, the user may utter a voice command requesting "Play My Music", whereupon the portable electronic device 100 can provide a haptic feedback as confirmation to the user that the instruction will be executed.

In some embodiments, the haptic feedback component 190 is configured to generate haptic feedback in conjunction with a device-initiated request. In contrast to the user-initiated request, the device-initiated request can be initiated without use of the switch 180. For example, the device-initiated request can be initiated by the processor in conjunction with an occurrence of an environmental event. In some examples, the environmental event can refer to a phone call, a calendar alert, an indication of a short messaging service (SMS) message, and the like. In conjunction with the occurrence of the environmental event, the processor can be configured to receive a request to generate haptic feedback, whereupon the processor can then be configured to generate a haptic feedback parameter that is based on the type of the environmental event.

In some embodiments, the portable electronic device 100 includes an audible feedback component 184. The audible feedback component 184 can refer to speakers or other component that is configured to generate a sound effect. In some embodiments, the audible feedback component 184 can refer to an active or a passive mechanism for generating the sound effect. For example, the active mechanism can refer to a speaker, while the passive mechanism can refer to generating ambient sound during generating of the haptic feedback.

In some embodiments, the audible feedback component 184 can be configured to supplement the haptic feedback that is generated by the haptic feedback component 190. For example, oscillation of a mass that is coupled to a permanent magnetic element of the haptic feedback component 190 can function in a manner similar to a diaphragm in that the vibration of the mass can produce ambient sound. In some embodiments, the processor can be configured to amplify the ambient sound that is output through use of the audible feedback component 184 so that the sound can be readily perceived by the user. In some embodiments, the processor can be configured to generate a sound effect, without interaction with the haptic feedback component 190, where the sound effect can be associated with the specific type of haptic feedback to be generated.

In one example, the audible feedback component 184 can generate a sound effect that simulates a quick tap against a hard surface in conjunction with the user quickly touching the switch 180. In another example, the audible feedback component 184 can generate a sound effect of a long, prolonged tap against a hard surface in conjunction with the user pressing on the switch 180 for a prolonged duration of time.

Figure 2A:
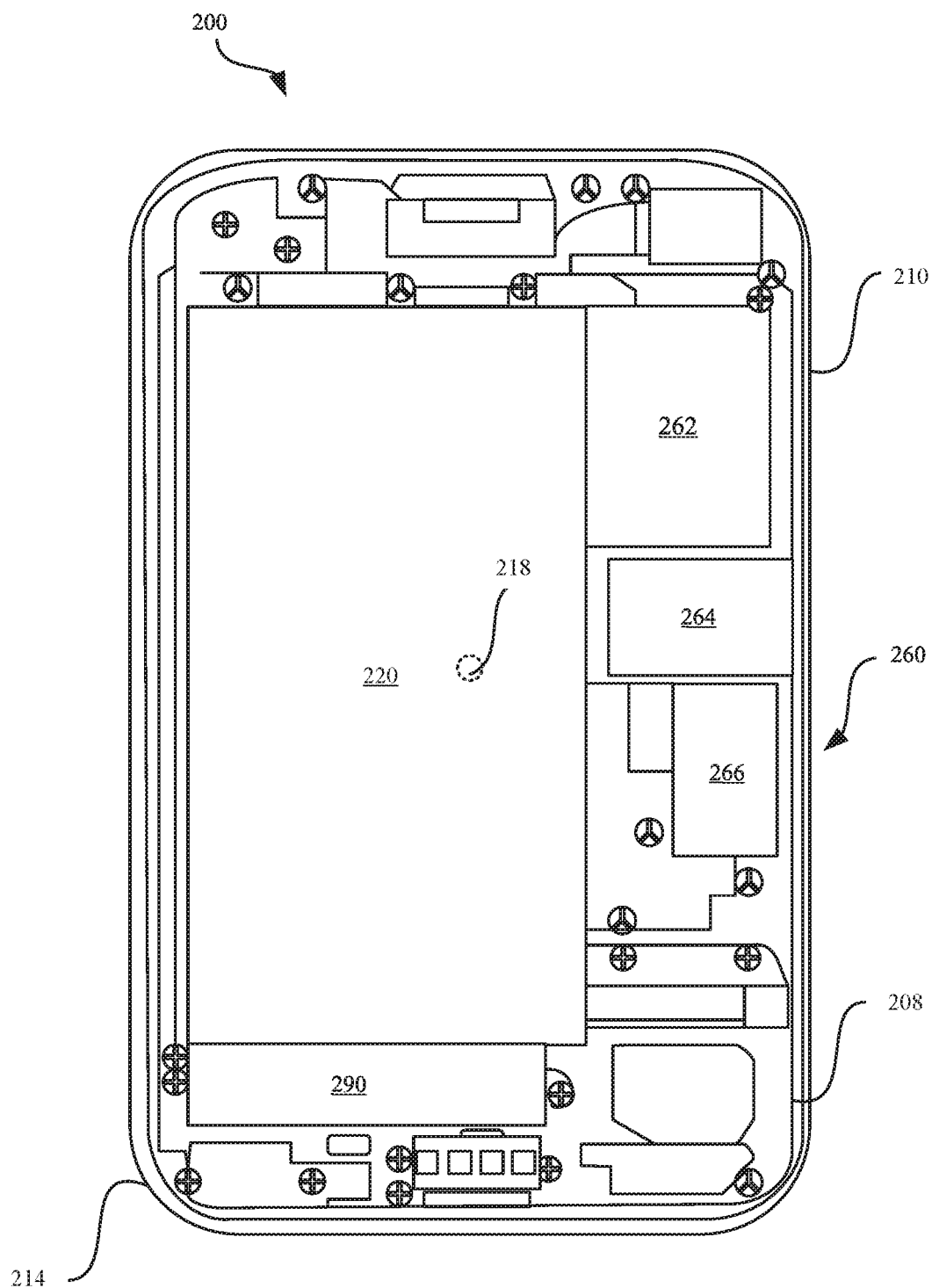
FIGS. 2A-2B illustrate cross-sectional views of a portable electronic device that can be configured to implement different aspects of the various techniques described herein, in accordance with some embodiments.
Figure 2B:
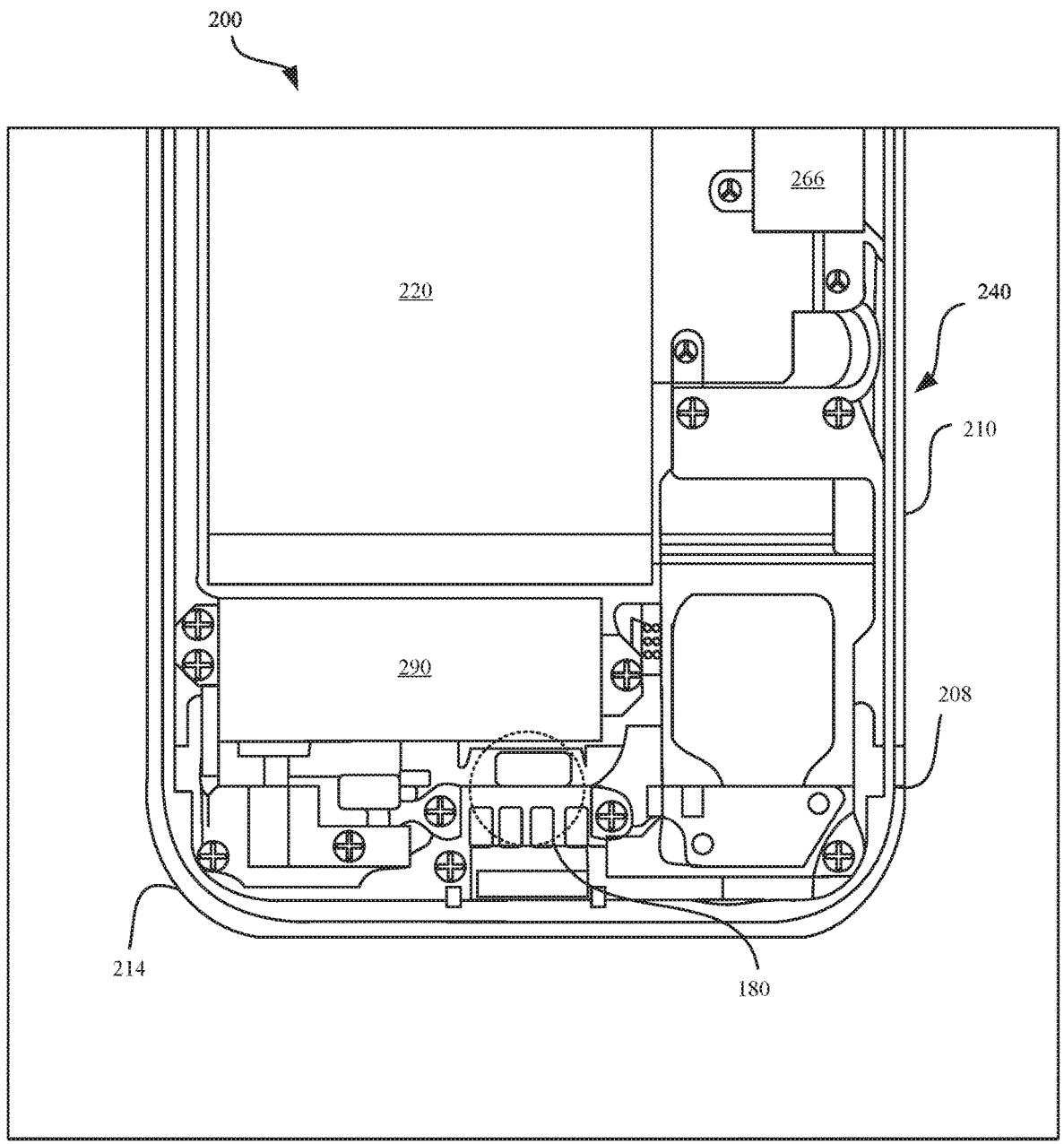

FIGS. 2A-2B illustrate cross-sectional views of a portable electronic device 200 that includes a haptic feedback component 290, in accordance with some embodiments. FIG. 2A shows that the haptic feedback component 290 is carried in a lower portion of an interior cavity 208 of the housing 210 and proximate to a corner 214 of the housing 210 of the portable electronic device 200. In this manner, the haptic feedback component 290 is substantially free to displace in at least one of an X-axis or Y-axis direction without being encumbered by the power supply 220 and main logic board 260. The main logic board 260 can include a processor 262, a subscriber identity module (SIM) reader 264, and a memory 266.

Furthermore, FIG. 2A shows that the haptic feedback component 290 is positioned away from a center of rotation 218 of the portable electronic device 200. The center of rotation 218 refers to a point in the interior cavity 208 that does not undergo planar movement. By positioning the haptic feedback component 290 as far away from the center of rotation 218 as possible can facilitate amplifying the haptic feedback that is generated in at least one of an X-axis or Y-axis direction by the haptic feedback component 290. In this manner, positioning the haptic feedback component 290 close to one of the corners 214 of the portable electronic device 200 can amplify the haptic feedback that is perceived by the user. In contrast, positioning the haptic feedback component 290 at or close to the center of rotation 218 would diminish the amount of haptic feedback that is generated and perceived by the user.

FIG. 2B illustrates a perspective close-up view of the haptic feedback component 290 relative to the switch 180. FIG. 2B shows that the haptic feedback component 290 can be positioned in an interior cavity 208 of the portable electronic device 200 and adjacent to the switch 180. In some embodiments, positioning the haptic feedback component 290 adjacent to the switch 180 can facilitate in providing haptic feedback that can be more readily and immediately felt by the user via the lower portion of the housing 210 in contrast to a haptic feedback component 290 that is positioned further away from the position of the switch 180. For example, in conjunction with a user-initiated request to generate haptic feedback, the user's appendage comes into contact with the switch 180. In conjunction with generating the haptic feedback, the user's appendage may still be in contact with at least one of the switch 180 or a surface of the lower portion of the housing 210. Thus, there is less distance for the force generated by the haptic feedback component 290 to reach the user's appendage if the user's appendage is still in contact with the switch 180 or in contact with the lower portion of the housing 210.

Figure 3:
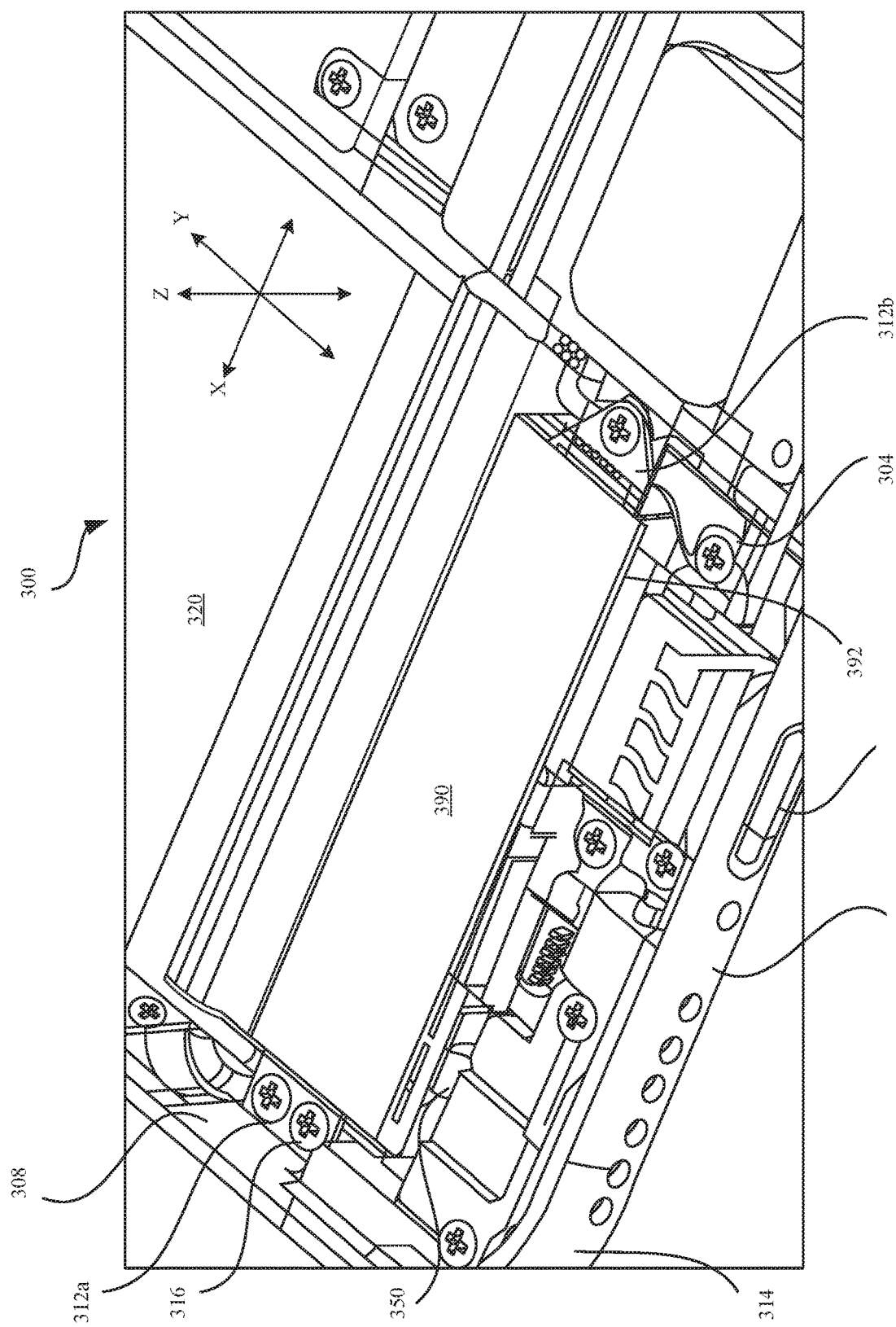
FIG. 3 illustrates a perspective view of a haptic feedback component that can be configured to implement different aspects of the various techniques described herein, in accordance with some embodiments.

FIG. 3 illustrates a perspective view of a haptic feedback component 390 carried by an interior cavity 308 of the portable electronic device 300, in accordance with some embodiments. FIG. 3 illustrates that the haptic feedback component 390 is adjacent to a power/data connector 302. The power/data connector 302 can be configured to provide power to the portable electronic device 300 from an external power source for charging the power supply 320. In addition, the power/data connector 302 can be configured to transmit and receive data to/from at least one of the electronic components (e.g., processor 262, SIM reader 264, memory 266) of the main logic board 260. In some embodiments, the power supply 320 can be configured to provide power to the haptic feedback component 390 via a board-to-board connector 350.

FIG. 3 illustrates that the haptic feedback component 390 is included within a retaining structure 392. The retaining structure 392 includes a plurality of mounting tabs 312a-b, where a first mounting tab 312a protrudes from a first end of the retaining structure 392 and a second mounting tab 312b protrudes from a second end of the retaining structure 392. In some examples, the first and second mounting tabs 312a-b can be positioned offset from each other so that they are misaligned. In some examples, misalignment of the first and second mounting tabs 312a-b from each other can be due to the first mounting tab 312a being positioned closer towards the corner 314. In particular, the corner 314 of the housing 310 is more likely to flex than a center of the interior cavity 308 (e.g., closer to center of rotation 218) where the second mounting tab 312b is positioned. Additionally, to compensate for the additional amount of flex at the corner 314 in conjunction with executing the haptic feedback, the retaining structure 392 can include two sets of fasteners 316 instead of a single fastener 316 at the first mounting tab 312a.

The mounting tabs 312a-b can be formed of rigid material such as metal or a metal alloy that is configured to be non-deformable or highly resistant to deformation. In this manner, the first and second mounting tabs 312a-b can securely couple the haptic feedback component 390 to the housing 310 while the haptic feedback component 390 generates haptic feedback that is translated to the housing 310. In some embodiments, the first and second mounting tabs 312a-b of the retaining structure 392 are each coupled to a protruding attachment feature 304 (e.g., boss) that protrudes from a wall of the housing 310. In some embodiments, the retaining structure 392 is only coupled to the wall of the housing 310 via the first and second mounting tabs 312a-b. In this manner, a gap (not illustrated) separates the entire bottom surface (not illustrated) of the haptic feedback component 390 and the wall of the housing 310 so as to allow the haptic feedback component 390 to displace in at least one of an X-axis, Y-axis, or Z-axis direction. Furthermore, the gap between the bottom surface of the haptic feedback component 390 and the wall of the housing 310 can allow the haptic feedback component 390 to displace in a Z-axis direction. For example, a high frequency of oscillation of a mass of the haptic feedback component 390 can cause displacement of the mass in the Z-axis direction. Beneficially, the gap provides sufficient clear for the haptic feedback component 390 to displace in the Z-axis direction. Furthermore, as the haptic feedback component 390 is coupled to the wall of the housing 310 via the first and second mounting tabs 312a-b, any force that is generated by displacement or oscillation of the mass of the haptic feedback component 390 is translated to the wall of the housing 310 via the first and second mounting tabs 312a-b.

In some examples, the gap between the bottom surface of the haptic feedback component 390 and the wall of the housing 310 is approximately 140 micrometers. In other embodiments, the gap is between about e.g., 30 micrometers to about 200 micrometers. In other embodiments, the gap is sufficiently large enough to allow the haptic feedback component 390 to hover (i.e., not touch) over the wall of the housing 310.

Figure 4:
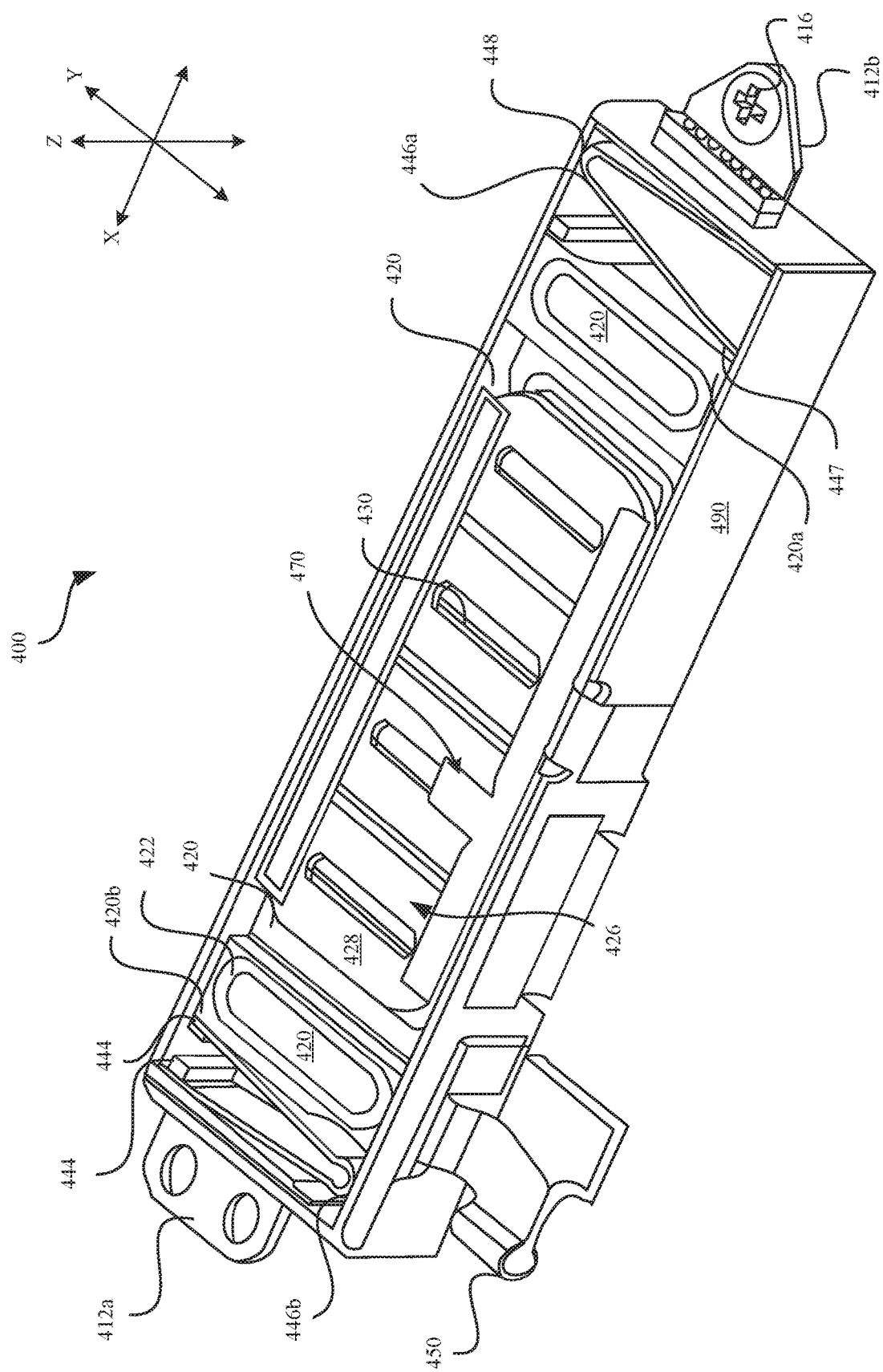
FIG. 4 illustrates a perspective view of a haptic feedback component that can be configured to implement different aspects of the various techniques described herein, in accordance with some embodiments.

FIG. 4 illustrates a perspective view of a haptic feedback component 400, which can be configured to execute the various techniques as described herein, according to some embodiments. The haptic feedback component 400 can be characterized as having a generally elongated shape in order to facilitate displacement of a mass 420 along an X-axis. As previously described herein, displacement of the mass 420 along the X-axis is responsible for generating haptic feedback that can be perceived by the user. Additionally, the elongated shape of the haptic feedback component 400 can be attributed to a similarly elongated shape of a retaining structure 490. In particular, the retaining structure 490 can be capable of carrying one or more magnetic coil elements 428 and one or more permanent magnetic elements 430.

In some examples, the retaining structure 490 can be fabricated from stainless steel. In particular, the retaining structure 490 can be shaped through a computerized numerical control (CNC) machining process. Beneficially, stainless steel lends itself to being easily machined via the CNC machining process according to a number of different shapes, such as rectangular, circular, polygonal, etc. Although, as illustrated in FIG. 4, the retaining structure 490 has a generally rectangular shape in order to facilitate linear displacement of the mass 420 along the X-axis.

FIG. 4 illustrates a first mounting tab 412a and a second mounting tab 412b that are included at opposing ends of the retaining structure 490 for coupling the haptic feedback component 400 to the wall of the housing 310. FIG. 4 shows that each mounting tab 412a-b can be configured to receive a fastener 416 that can couple each of the mounting tabs 412a-b to a protruding attachment feature 304 of the wall of the housing 310.

Figure 7:
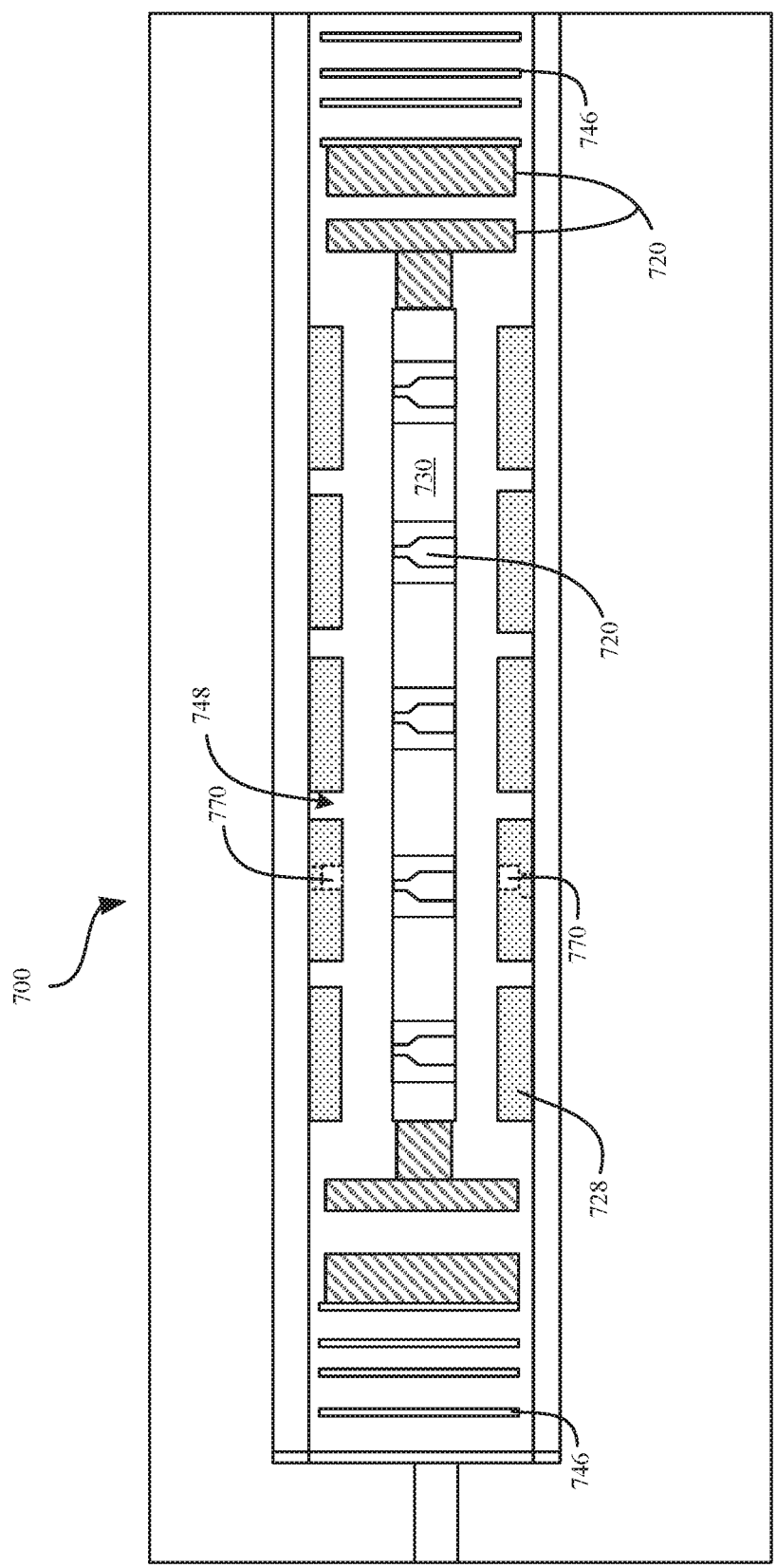
FIG. 7 illustrates a cross-sectional view of a haptic feedback component that can be configured to implement different aspects of the various techniques described herein, in accordance with some embodiments.

As illustrated in FIG. 4, the magnetic coil elements 428 can be positioned to overlap the permanent magnetic permanent elements 430, as described in greater detail in conjunction with FIG. 7. In some cases, the magnetic coil elements 428 can be coupled to the retaining structure 490. Additionally, the magnetic coil elements 428 can be secured to the mass 420. In some examples, the mass 420 can be comprised of a metal, such as tungsten. In some examples, the mass 420 can be comprised of a series of individual tungsten balls. In particular, the series of individual tungsten balls can be secured to the retaining structure 490 via an adhesive.

According to some embodiments, the mass 420 can be coupled to the permanent magnetic elements 430 via an adhesive 422. In this manner, during actuation of the haptic feedback component 400, the mass 420 and the permanent magnetic elements 430 remain coupled and both are configured to displace together in a synchronous manner. In particular, while the mass 420 and the permanent magnetic elements 430 are being displaced in the synchronous manner, the magnetic coil elements 428 remain in a fixed position (e.g., secured to the retaining structure 490). In this manner, the magnetic coil elements 428 are prevented from obstructing the displacement of the mass 420 and permanent magnetic elements 430. In some examples, the magnetic coil elements 428 can be insulated. In some embodiments, the permanent magnetic elements 430 are formed of a metal or a metal alloy that includes at least one of nickel, aluminum, or iron, and the like.

According to some embodiments, the retaining structure 490 includes a set of springs 446a-b, where the springs 446a-b are coupled to the mass 420. In particular, a first spring 446a is coupled to a first corner 420a of the mass 420, and a second spring 446b is coupled to a second corner 420b of the mass 420. As illustrated in FIG. 4, a single spring 446 is coupled to each end of the mass 420. In particular, the springs 446a-b can amplify the linear displacement of the mass 420 along the X-axis. In some examples, the springs 446a-b can be welded or glued (via an adhesive) to the mass 420.

In some examples, each spring 446 can include a spring coupling arm 448 and a distal end 447. Each distal end 447 of the spring 446 can include a dampener 444 that can be configured to compress against another dampener 444 of another distal end 447 of the same spring 446 when the distal ends 447 of the spring 446 are compressed together. For example, the distal ends 447 of the spring 446 can be compressed together when the mass 420 is displaced in a linear direction towards the spring 446. Additionally, the dampener 444 and the spring 446 can prescribe a minimum/maximum displacement range for the mass 420 in conjunction with the actuation mode. In addition, the dampener 444 can be configured to reduce or prevent ambient sounds caused by the displacement of the mass 420.

In some embodiments, the retaining structure 490 can include a dampening fluid 426 that can be dispersed throughout the permanent magnetic elements 430. The dampening fluid 426 can be configured to minimize or stop the displacement of the permanent magnetic elements 430 in conjunction with the haptic feedback component 400 generating haptic feedback. In some examples, the dampening fluid 426 is a ferrofluid, which can refer to a liquid that becomes strongly magnetized in the presence of the magnetic field that is generated by the magnetic coil elements 428. The ferrofluid includes nanoscale ferromagnetic or ferrimagnetic particles suspended in a carrier fluid (e.g., solvent). In some examples, the ferrofluid can be configured to dampen or minimize the ambient noise generated during oscillation of the mass 420.

In conjunction with the haptic feedback component 400 operating in the actuation mode, electrical current that is received from the power supply 220 is transmitted to the magnetic coil elements 428 to cause the magnetic coil elements 428 to generate a magnetic field. The magnetic field that is generated by the magnetic coil elements 428 can interact with respective magnetic fields generated by the permanent magnetic elements 430, such as through establishing a magnetic circuit and/or magnetic communication between the magnetic coil elements 428 and the permanent magnetic elements 430. In some embodiments, the magnetic fields generated or established by the magnetic coil elements 428 are adjusted/variable according to at least one haptic feedback parameter that is generated by the processor 262. In some examples, the at least one haptic feedback parameter can control polarity, amplitude, frequency, or pulse of the electrical current. The electrical current can be received at the haptic feedback component 400 from the power supply 220 via the board-to-board connector 450. The board-to-board connector 450 can be coupled to a flex cable (not illustrated) that is electrically coupled to the processor 262. Adjusting the at least one haptic feedback parameter that is generated by the processor 262 can adjust the electrical current that is provided to the haptic feedback component 400. In turn, adjusting the electrical current can affect the magnetic field generated by the magnetic coil elements 428 thus affecting at least one of a position, velocity, acceleration, momentum, or frequency of the displacement of the mass 420.

According to some embodiments, the processor 262 can utilize a sensor—e.g., a magnetic field sensor 470—to detect a position of the mass 420 that is coupled to the permanent magnetic element 430 in conjunction with executing haptic feedback. As previously described herein, the mass 420 displaces while executing the haptic feedback. In particular, the magnetic field sensor 470 (e.g., a Hall effect sensor) can be configured to generate an electrical signal (e.g., output voltage) based on the magnetic field flux density that surrounds the magnetic field sensor 470. In some examples, the magnetic flux density can refer to a magnetic field that is generated by the permanent magnetic element 430 while being displaced with the mass 420. When the permanent magnetic element 430 (and the mass 420) displace into proximity of the magnetic coil elements 428, the permanent magnetic element 430 can alter the magnetic field that is detected by the magnetic field sensor 470. Accordingly, this change in the magnetic field surrounding the magnetic coil elements 428 can be induced by the displacement of the permanent magnetic element 428. As the permanent magnetic element 428 displaces in closer proximity to the magnetic field sensor 470, the change in the magnetic field is correspondingly increased. In some cases, the magnetic field sensor 470 can provide a detection signal that indicates the change in the magnetic field, thus providing an indication of whether the permanent magnetic element 430 (and the mass 420) are in close proximity to the magnetic field sensor 470.

In some cases, the magnetic field sensor 470 can be configured to provide a digital output—either an "on state" or an "off state." When the change in the magnetic field surrounding the magnetic field sensor 470 exceeds a magnetic field threshold (e.g., disrupts the surrounding magnetic field), the magnetic field sensor 470 can be configured to provide a digital output that corresponds to the "on state." The digital output of the "on state" can indicate a discrete position of the permanent magnetic element 430, such as indicating when the permanent magnetic element 430 is in its closest proximity to the magnetic field sensor 470. Accordingly, the magnetic field sensor 470 is capable of providing the digital output when the mass 420 is in close proximity to the magnetic field sensor 470. Alternatively, when the change in the magnetic field is less than the magnetic field threshold, then the magnetic field sensor 470 provides a digital output that corresponds to the "off state," which indicates that the permanent magnetic element 430 is not in close proximity to the magnetic field sensor 470. In some examples, the haptic feedback component 400 can include multiple magnetic field sensors 470 that are positioned throughout various locations along the length (e.g., along the X-axis) of the retaining structure 490 in order to detect multiple discrete positions of the mass 420 as it is being displaced in conjunction with executing the haptic feedback. In particular, each magnetic field sensor 470 can have its own respective magnetic field threshold, and can be configured to provide a respective digital output signal when the magnetic field flux density exceeds the magnetic field threshold.

In some cases, the magnetic field sensor 470 can be configured to provide an analog output that is proportional to the change in the magnetic field that surrounds the magnetic field sensor 470. In particular, the magnetic field sensor 470 can generate the analog output in order to provide a continuous voltage output that relates to the strength/weakness of the magnetic field surrounding the magnetic field sensor 470. In one example, as the change in the magnetic field increases, the output signal by the magnetic field sensor 470 (utilizing an amplifier) correspondingly increases. In some cases, the change in voltage output generated by the magnetic field sensor 470 can be used to detect a relative current position of the mass 420 coupled to the permanent magnetic element 430. For example, an analog-to-digital converter can utilize a lookup table to correlate the change in voltage output to an actual current position of the mass 420. In this manner, the analog output can indicate an infinite number of current positions associated with the mass 420.

Other types of sensors can be utilized to detect the position of the mass 420 while it is being displaced in conjunction with executing haptic feedback. In one example, the sensor can refer to an optical light sensor that can be configured to utilize a measured amount of light reflectivity to detect the position of the mass 420. In one example, the mass 420 can include a reflective component (e.g., reflective tape) that is affixed to the mass 420. As the mass 420 displaces in the linear direction, the optical light sensor can measure the amount of light reflected by the reflective component in order to determine a relative position of the mass 420.

According to some embodiments, the haptic feedback component 400 does not include a sensor (e.g., magnetic field sensor, optical light sensor, etc.) for determining the position of the mass 420 coupled to the permanent magnetic element 430. Instead the haptic feedback component 400 is a sensor-less system that can rely upon measuring a counter-electromotive force/back electromotive force (back EMF). For example, the back EMF can refer to a voltage drop caused by the magnetic field inducing an electrical current inside the magnetic coil elements 428. In particular, the magnetic field changes due to displacement of the permanent magnetic element 430. For example, the strength of the back EMF can provide an indication as to the movement of the permanent magnetic element 430 relative to the magnetic coil elements 428. Thus, when the magnetic coil element 428 is inactive (e.g., not generating a magnetic field), the permanent magnetic element 430 does not generate back EMF.

Alternatively, when the permanent magnetic element 430 generates the magnetic field, the haptic feedback component 400 can monitor for the back EMF generated by the permanent magnetic element 430. In some examples, the shape of the waveform of the back EMF signal can indicate a position of the permanent magnetic element 430 relative to the magnetic coil elements 428. Thus, the haptic feedback component 400 can determine a position of the permanent magnetic element 430 based on the back EMF, and can selectively adjust an amount of a subsequent haptic feedback based on the position of the permanent magnetic element 430. Beneficially, monitoring for changes in the back EMF can contribute to establishing an accurate sensor-less closed loop feedback system for the haptic feedback component 400 that can improve system reliability and longevity while reducing costs associated with implementing sensors.

In any case, the haptic feedback component 400 can utilize a component (e.g., sensor, back EMF, etc.) that detects the position of the mass 420 while it is being displaced in conjunction with a first haptic feedback event to prevent misfire of the haptic feedback component 400 in conjunction with generating a second haptic feedback event. For example, if a sensor is unable to determine an accurate position of the mass 420 in conjunction with generating the first haptic feedback event, then the processor 262 is unable to accurately determine the appropriate haptic feedback parameters (e.g., frequency of an electrical current) required to (i) stop the initial haptic feedback event, and (ii) execute the second haptic feedback event. Consequently, without such component, can result in delayed execution of the second haptic feedback event.

Figure 5:
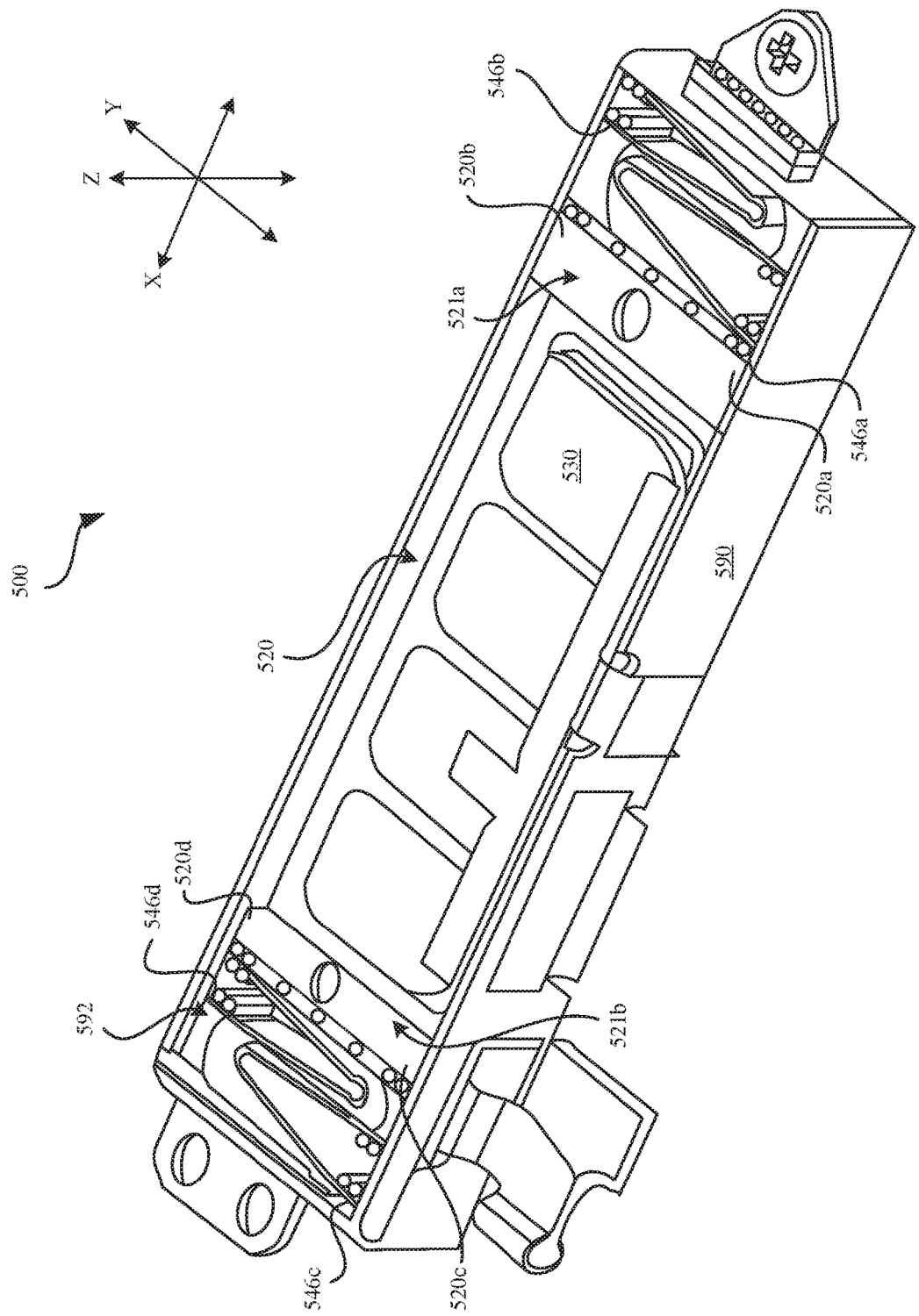
FIG. 5 illustrates a perspective view of a haptic feedback component that can be configured to implement different aspects of the various techniques described herein, in accordance with some embodiments.

FIG. 5 illustrates a perspective view of a haptic feedback component 500, in accordance with some embodiments. As illustrated in FIG. 5, the haptic feedback component 500 is a cutaway, where the magnetic coil elements (not illustrated) are removed in order to show the permanent magnetic elements 530. As previously described herein, in conjunction with the haptic feedback component 500 operating in an actuation mode, the permanent magnetic elements 530 can be configured to repel or attract the magnetic coil elements 428 depending on a change in a polarity of the magnetic field generated by the magnetic coil elements 428. In some embodiments, the permanent magnetic elements 530 can establish a magnetic circuit with the magnetic coil elements 428 such as to cause a mass 520 to be displaced.

As illustrated in FIG. 5, the haptic feedback component 500 can include a mass 520 and springs 546a-d that are coupled to the first and second ends 521a-b of the mass 520. According to some embodiments, the mass 520 includes a first end 521a and a second end 521b that is generally opposite the first end 521a. In particular, a first spring 546a is coupled to a first corner 520a of the first end 521a. Additionally, a second spring 546b is coupled to a second corner 520b of the first end 521a. Moreover, a third spring 546c is coupled to a third corner 520c of the second end 521b of the mass 520. Furthermore, a fourth spring 546d is coupled to a fourth corner 520d of the second end 521b. In this manner, all four corners 520a-d of the mass 520 are secured to a respective spring 546. In this manner, the four springs 546a-d can be capable of amplifying momentum of the mass 520 that is generated by the haptic feedback component 500.

Additionally, coupling the mass 520 to four springs 546a-d can prevent undesirable rocking motion of the mass 520 along the Y-axis/Z-axis while executing the haptic feedback. Consider, for example, that relative to the haptic feedback component 400 (as described in conjunction with FIG. 4), the haptic feedback component 500 has larger dimensions (e.g., area, size, length, etc.). As a result of having larger dimensions, the haptic feedback component 500 includes a mass 520 that is greater in size and weight than the mass 420 of the haptic feedback component 400. Thus, the mass 520 may require more amplification power than the mass 420 in order to (1) initially displace the mass 520, and (2) stop the mass 520 from displacing. For instance, consider that the mass 520 may be susceptible to swaying along the Y-axis/Z-axis. However, this swaying motion can be detrimental to the haptic feedback component 500 in that the mass 520 may knock against the walls of the retaining structure 590. If springs 546 were only coupled to two corners of the mass 520, then it would be more difficult for the haptic feedback component 500 to control the mass 520 to prevent the mass 520 from swaying along the Y-axis/Z-axis due to its enlarged size and weight. To address this scenario, springs 546a-d can be coupled to the mass 520 at all four of its corners. In this manner, the haptic feedback component 500 can prevent or minimize the mass 520 from swaying along the Y-axis/Z-axis, while limiting the mass 520 to displacing only along a linear direction that corresponds to the X-axis. Additionally, coupling the springs 546a-d to all four corners of the mass 520 can prevent or minimize the mass 520 from swaying along the Y-axis/Z-axis in response to the haptic feedback component 500 generating haptic feedback at certain frequencies.

According to some embodiments, each of the springs 546a-d can be characterized as having a length that is similar to a corresponding length of the first and second ends 521a-b of the mass 520. It is noted that the retaining structure 590 has a shape and size for receiving the mass 520 and the first and second ends 521a-b of the mass 520. Beneficially, each spring 546 has a length that takes full advantage of the entire amount of available space within the internal cavity 592. By increasing the respective length of each spring 546, the spring constant of each spring 546 is reduced, which can result in increased displacement of the spring 546. In some examples, the first and second springs 546a-b can be positioned to sit over one another along the Y-axis. In other examples, the first and second springs 546a-b can have reduced lengths, which results in increased spring stiffness. In other examples, the first and second springs 546a-b can be positioned in a column that is parallel to the Y-axis.

Figure 6:
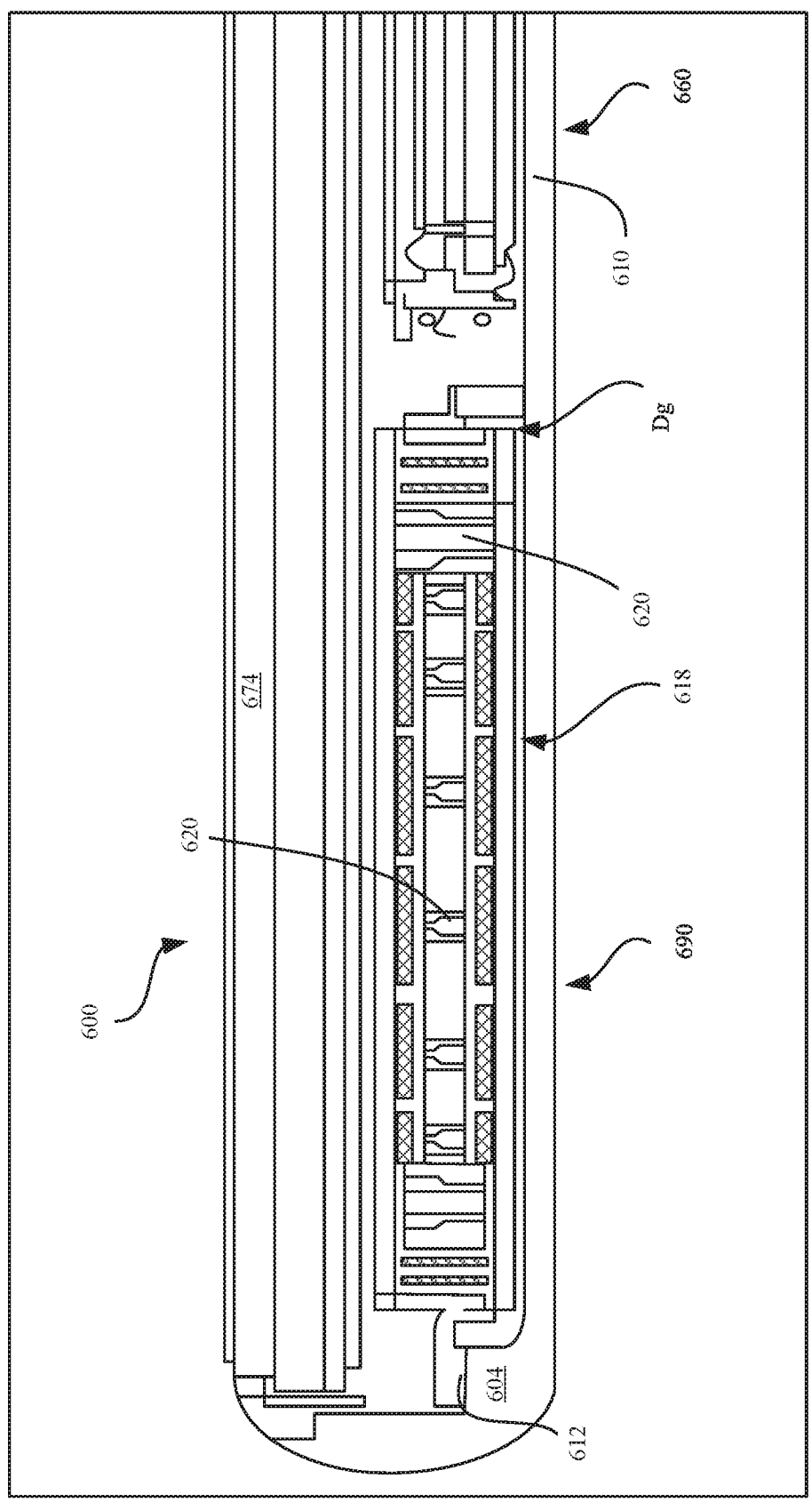
FIG. 6 illustrates a cross-sectional view of a portable electronic device that can be configured to implement different aspects of the various techniques described herein, in accordance with some embodiments.

FIG. 6 illustrates a cross-sectional view of a portable electronic device 600, in accordance with some embodiments. FIG. 6 shows that the portable electronic device 600 includes a haptic feedback component 690 and a main logic board 660. The haptic feedback component 690 and the main logic board 660 can be positioned below the display module 674. The haptic feedback component 690 can be coupled to a protruding attachment feature 604 (e.g., boss) that extends from a wall of the housing 610 via mounting tabs 612. As shown in FIG. 6, a gap ($D_g$) is positioned between a bottom surface 618 of the haptic feedback component 690 and the wall of the housing 610 such that the haptic feedback component 690 is coupled to the wall of the housing 610 via only the mounting tabs 612. In some examples, the gap ($D_g$) is approximately 140 micrometers.

As shown in FIG. 6, the haptic feedback component 690 can include at least one mass 620 that is of sufficient size and shape to generate a force that can be translated to the housing 610 and perceived by the user. In some examples, the range of force that is generated in conjunction with generating haptic feedback is between about 0.1 N to about 3 N.

FIG. 7 illustrates a cross-sectional view of a haptic feedback component 700, in accordance with some embodiments. FIG. 7 shows that the haptic feedback component 700 is a substantially elongated structure that includes springs 746 coupled to opposing ends of a mass 720. FIG. 7 illustrates that the mass 720 is coupled to permanent magnetic elements 730 that are arranged in a row along a length of the haptic feedback component 700. Magnetic coil elements 728 can be positioned above and below the permanent magnetic elements 730. Additionally, the magnetic coil elements 728 can be separated by an air gap 748.

FIG. 7 further illustrates one or more magnetic field sensors 770 that are positioned within a recess of the magnetic coil element 728. As previously described herein, the magnetic coil element 728 is coupled to the retaining structure and fixed in position. Accordingly, and as previously described herein, the magnetic field sensors 770 can be configured to determine a position of the mass 720 that is displacing in conjunction with executing haptic feedback. In some examples, the magnetic field sensors 770 can be positioned above the mass 720 and below the mass 720.

FIGS. 8A-8B illustrate top views of a haptic feedback component 800 in conjunction with a non-actuation mode and an actuation mode, respectively. FIG. 8A illustrates the haptic feedback component 800 in conjunction with the non-actuation mode. The haptic feedback component 800 can include a mass 820 that is coupled to permanent magnetic elements 830 via a weld or an adhesive. In some examples, each of the permanent magnetic elements 830 can be positioned within a recess 826 of the mass 820. Additionally, each end of the mass 820 can be coupled to springs 846a-d that can be configured to amplify the displacement of the mass 820 along a linear direction in conjunction with the actuation mode (as described in conjunction with FIG. 8B).

In some examples, separate corners of a first end of the mass 820 can be coupled to the springs 846a, b, and separate corners of a second end of the mass 820 can be coupled to the springs 846c, d. Further, in some examples, by coupling each corner of the mass 820 to a spring 846, the haptic feedback component 800 can prevent the mass 820 from swaying in a non-linear direction (e.g., along a Z-axis). As previously described herein, magnetic coil elements 828 are fixed in position within the haptic feedback component 800 and are configured to generate a magnetic field in conjunction with the actuation mode. During the non-actuation mode, the haptic feedback component 800 does not receive an electrical current from the power supply 220. In turn, the magnetic coil elements 828 do not generate a magnetic field that is sufficient to displace the mass 820. However, in some embodiments, the mass 820 can be displaced to some degree if a sufficient amount of external force is applied to the haptic feedback component 800. For example, if a user shakes the portable electronic device 100 in a back-and-forth motion, then the mass 820 can displace in a linear direction.

Turning now to FIG. 8B illustrates the haptic feedback component 800 in conjunction with the actuation mode. In some examples, the actuation mode can refer to when the haptic feedback component 800 receives an electrical current from the power supply 220 and causes the magnetic coil elements 828 to generate the magnetic field. The magnetic field can be adjusted/vary by the processor 262 in order to generate haptic feedback events of different strengths. For example, as illustrated in FIG. 8B, if the permanent magnetic elements 830 and the magnetic coil elements 828 share a similar polarity, the permanent magnetic element 830 are repelled from the magnetic coil element 828. As the permanent magnetic element 830 is coupled to the mass 820, the mass 820 is also repelled from the magnetic coil elements 828 as indicated by direction ($D_1$).

As illustrated in FIG. 8B, the springs 846a-b contract as the permanent magnetic elements 830 are displaced along the direction $D_1$ towards these springs 846a-b. Additionally, the springs 846c-d are extended to facilitate the displacement of the mass 820 along direction $D_1$. As the springs 846a-b are compressed, the dampeners 844 at the distal ends of the springs 846a-b contact with each other so as to reduce any ambient noise caused by compressing these springs 846a-b together. Although not illustrated in FIG. 8B, the magnetic coil elements 828 can cause the mass 820 to displace in a direction opposite $D_1$ if the magnetic coil elements 828 generate a magnetic field having an opposite polarity to the example previously described. As previously described herein, sensors (e.g., magnetic field sensors, optical light sensors, etc.) can be utilized to determine the position of the mass 820 during the actuation mode.

In some embodiments, the actuation mode can be characterized with a specific waveform profile. The waveform profile can provide a functional relationship between frequency (Hz) and momentum (g*mm/s). In some examples, the frequency can have a range between e.g., about 50 Hz to about 500 Hz. In some examples, the momentum can have a range between about 0 g*mm/s to about 3000 g*mm/s. In some embodiments, the haptic feedback parameter specifies an amount of power (e.g., electrical current) that is provided to the haptic feedback component 800. Subsequently, changing the power provided to the haptic feedback component 800 can cause a change in displacement of the mass 820, which can affect the waveform profile associated with the displacement of the mass 820. In some examples, a specific waveform profile can be associated with a specific type of haptic feedback to be generated. For example, quickly touching the switch 180 can cause the haptic feedback component 800 to generate a short burst of haptic feedback, which is associated with a short frequency and a high degree of momentum of the mass 820. In another example, holding the switch 180 for a long period of time can cause the haptic feedback component 800 to generate a prolonged burst of haptic feedback, which is associated with a longer frequency and a shorter degree of momentum of the mass 820 relative to the short burst of haptic feedback.

Figure 9:
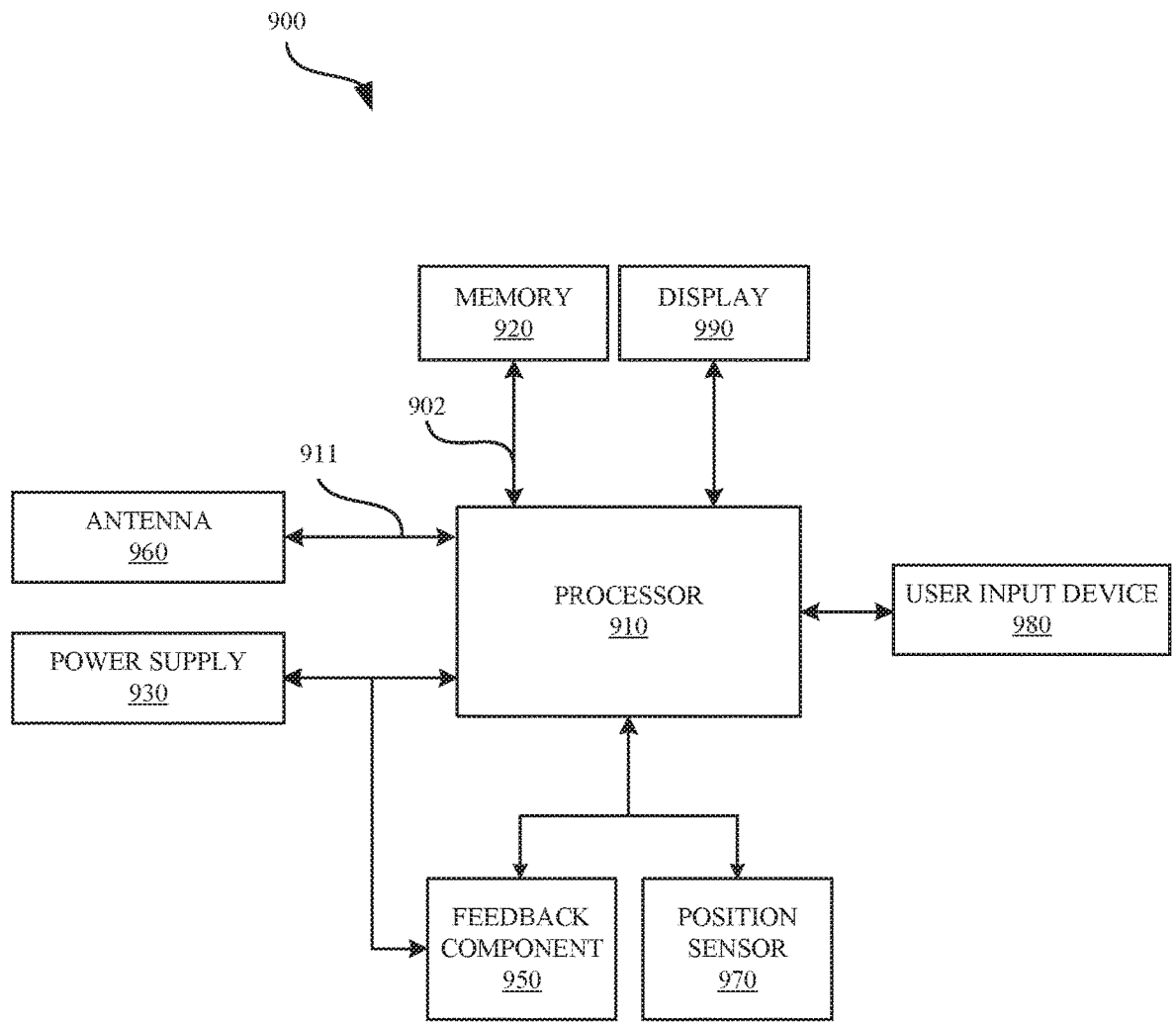
FIG. 9 illustrate a block diagram of a portable electronic device that can be configured to implement different aspects of the various techniques described herein, in accordance with some embodiments.

FIG. 9 illustrates a block diagram of a portable electronic device 900 that can be used to implement the various techniques described herein, according to some embodiments. In particular, the detailed view illustrates various components that can be included in the portable electronic device 100 as illustrated in FIG. 1. As shown in FIG. 9, the portable electronic device 900 can include a processor 910 for controlling the overall operation of the portable electronic device 900. The portable electronic device 900 can include a display 990. The display 990 can be a touch screen panel that can include a sensor (e.g., capacitance sensor). The display 990 can be controlled by the processor 910 to display information to the user. A data bus 902 can facilitate data transfer between at least a memory 920 and the processor 910. The portable electronic device 900 can also include a network/bus interface 911 that couples a wireless antenna 960 to the processor 910.

The portable electronic device 900 can include a user input device 980, such as a switch. The user input device 980 can refer to a solid state switch relay that can be configured to detect a change in capacitance when a user's appendage makes contact with the user input device 980. The user input device 980 can be configured to generate an output voltage that corresponds to the change in capacitance, whereupon the output voltage is transmitted as an electrical signal to the processor 910. In some embodiments, an A/D converter (not illustrated) can be configured to convert the analog signal of the output voltage into an electrical signal that can processed by the processor 910.

In some embodiments, the portable electronic device 900 includes a haptic feedback component 950 that can be configured to generate haptic feedback based on a haptic feedback parameter that is generated by the processor 910. In some examples, the haptic feedback can be generated in conjunction with a user-initiated request. For example, the user-initiated request can be initiated by a user pressing down on the user input device 980. In other examples, the haptic feedback can be generated in conjunction with a device-initiated request. For example, the device-initiated request can be initiated by the portable electronic device 900 receiving a notification (e.g., phone call, text message, etc.) via a wireless antenna 960.

According to some embodiments, the portable electronic device 900 can include a position sensor 970 that can be configured to detect a position of a movable mass—e.g., the mass 820—in conjunction with the feedback component 950 executing an initial haptic feedback event, as previously described herein. By utilizing the position of the mass 820, the processor 910 can adjust a feedback parameter of the mass 820 (e.g., velocity, acceleration, and the like) in conjunction with executing a subsequent haptic feedback event. In this manner, the feedback component 950 prevents any mis-fires or delays in executing the subsequent haptic feedback event. For example, the processor 910 can receive a subsequent request to execute a subsequent haptic feedback event, while the initial haptic feedback event is being executed. Instead of the processor 910 having to wait for the haptic feedback component 950 to finish executing the initial haptic feedback event, the processor 910 can utilize the position of the mass 820 to interrupt the initial haptic feedback event so as to execute the subsequent haptic feedback event. Consider, for example, a scenario where the processor 910 receives a request to execute an initial haptic feedback event in response to receiving a text message. In turn, the processor 910 can provide an instruction that causes the feedback component 950 to execute the initial haptic feedback event. While executing the initial haptic feedback event, the processor 910 can receive another request to execute a subsequent haptic feedback event in response to the user depressing a switch—e.g., switch 180—to initiate an intelligent personal assistant and knowledge navigator that is established at the portable electronic device 900. In turn, the processor 910 can instruct the position sensor 970 to determine a feedback characteristic, such as a position of the mass 820 relative to the magnetic coil element 828. Additionally, based on the position of the mass 820, the processor 910 can determine feedback characteristics of the mass 820 such as acceleration, velocity, frequency, wavelength, and the like. For example, based on the position of the mass 820, the processor 910 can be configured to determine the velocity of the mass 820 by utilizing an amount of time elapsed as an underlying coefficient. Subsequently, the processor can establish a feedback parameter (e.g., amplitude, acceleration, etc.) for the subsequent haptic feedback event. Accordingly, the processor 910, the position sensor 970, and the feedback component 950 can establish a closed loop feedback system (or feedback control system).

According to some embodiments, the processor 910 can utilize the position of the mass 820 to optimize the amount that the mass 820 displaces within the feedback component 950. For example, the processor 910 can detect an amount of clearance (e.g., space not occupied by the mass 820) that is present in the feedback component 950. In turn, the feedback component 950 can adjust the feedback parameter (e.g., velocity, acceleration, amplitude, frequency, waveform, etc.) such that the mass 820 maximizes the amount of clearance without knocking against the walls of the feedback component 950.

According to some embodiments, the closed feedback loop system established by the feedback component 950 and the position sensor 970 can be utilized to adjust a respective waveform for each haptic feedback event. In some cases, in conjunction with interrupting the initial haptic feedback event, the processor 910 can establish a feedback parameter (e.g., waveform) for the subsequent haptic feedback event that builds from the waveform of the initial haptic feedback event. In one example, although the respective waveforms associated with the initial and subsequent haptic feedback events can be similar (e.g., operating at ~900 Hz), the processor 910 can modify the frequency of the subsequent haptic feedback event in order to build off the momentum generated by the waveform of the initial haptic feedback event. Beneficially, in this manner, the portable electronic device 900 can conserve some amount of power in executing the subsequent haptic feedback event. Additionally, building off the momentum generated by the waveform of the initial haptic feedback event can facilitate a smooth transition to the subsequent haptic feedback event that is perceivable by the user.

According to some embodiments, the closed feedback system established by the feedback component 950 and the position sensor 970 can be configured to compensate for any deficiencies of the feedback component 950 in conjunction with executing a haptic feedback event. Consider, for example, a scenario where the adhesive that couples the mass 820 to a retaining structure—e.g., the retaining structure 490—of the feedback component 950 degrades over time. As a result, the degradation of the adhesive causes the mass 820 to "stick" in position (making it more difficult to displace). Thus, the feedback component 950 can be required to generate more power (relative to a normal operating level) in order to displace the mass 820 from its "stuck" position. By utilizing the position sensor 970, the processor 910 can determine that the feedback component 950 is not operating at its normal operating level, and, in turn, the processor 910 can compensate for these deficiencies by generating a modified amount of haptic feedback—which the user will perceive as being identical in strength to the haptic feedback generated by the feedback component 950 while operating at its normal level. In this manner, the feedback component 950 can be configured to maintain an optimal level of haptic feedback regardless of the wear of the hardware components. Beneficially, this prevents any need to modify the hardware components/replace hardware components.

The portable electronic device 900 also includes a memory 920, which can comprise a single disk or multiple disks (e.g., hard drives), and includes a storage management module that manages one or more partitions within the memory 920. In some embodiments, the memory 920 can include flash memory, semiconductor (solid state) memory or the like. The portable electronic device 900 can also include a Random Access Memory (RAM) and a Read-Only Memory (ROM). The ROM can store programs, utilities or processes to be executed in a non-volatile manner. The RAM can provide volatile data storage, and stores instructions related to the operation of the portable electronic device 900.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium. The computer readable medium is any data storage device that can store data which can thereafter be read by a computer system. Examples of the computer readable medium include read-only memory, random-access memory, CD-ROMs, DVDs, magnetic tape, hard disk drives, solid state drives, and optical data storage devices. The computer readable medium can also be distributed over network-coupled computer systems so that the computer readable code is stored and executed in a distributed fashion.

Figure 10:
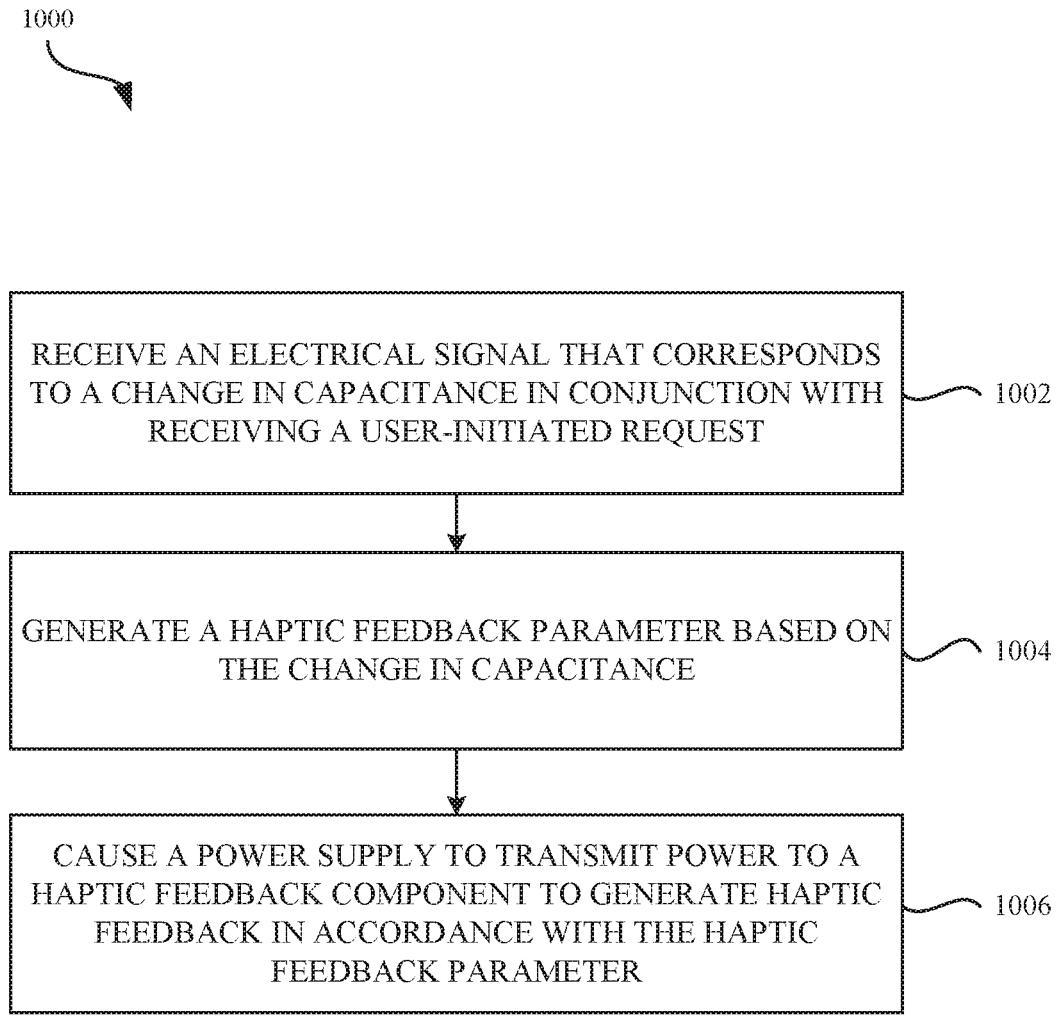
FIG. 10 illustrates a method for executing haptic feedback at a portable electronic device, in accordance with some embodiments.

FIG. 10 illustrates a method 1000 for executing haptic feedback at a portable electronic device—e.g., the portable electronic device 900—in conjunction with a user-initiated request, in accordance with some embodiments. The method 1000 begins at step 1002, where the processor 910 receives an electrical signal that corresponds to a change in capacitance in conjunction with receiving the user-initiated request. For example, the user-initiated request can be initiated by the user's appendage touching the switch 180. In some examples, the electrical signal is an output voltage that can correspond to the change in capacitance that is detected by the switch 180.

At step 1004, the processor 910 can be configured to generate a haptic feedback parameter that is based on the change in capacitance. In some examples, the haptic feedback parameter can refer to an amplitude, frequency, pulse, or polarity of an electrical current that is to be transmitted from the power supply 930 to the haptic feedback component 950.

At step 1006, the processor 910 can cause the power supply 930 to transmit an amount of power (e.g., electric current) to the haptic feedback component 950 that is based on the haptic feedback parameter such as to generate the haptic feedback. Accordingly, the portable electronic device 900 is configured to generate haptic feedback in conjunction with receiving the user-initiated request.

Figure 11:
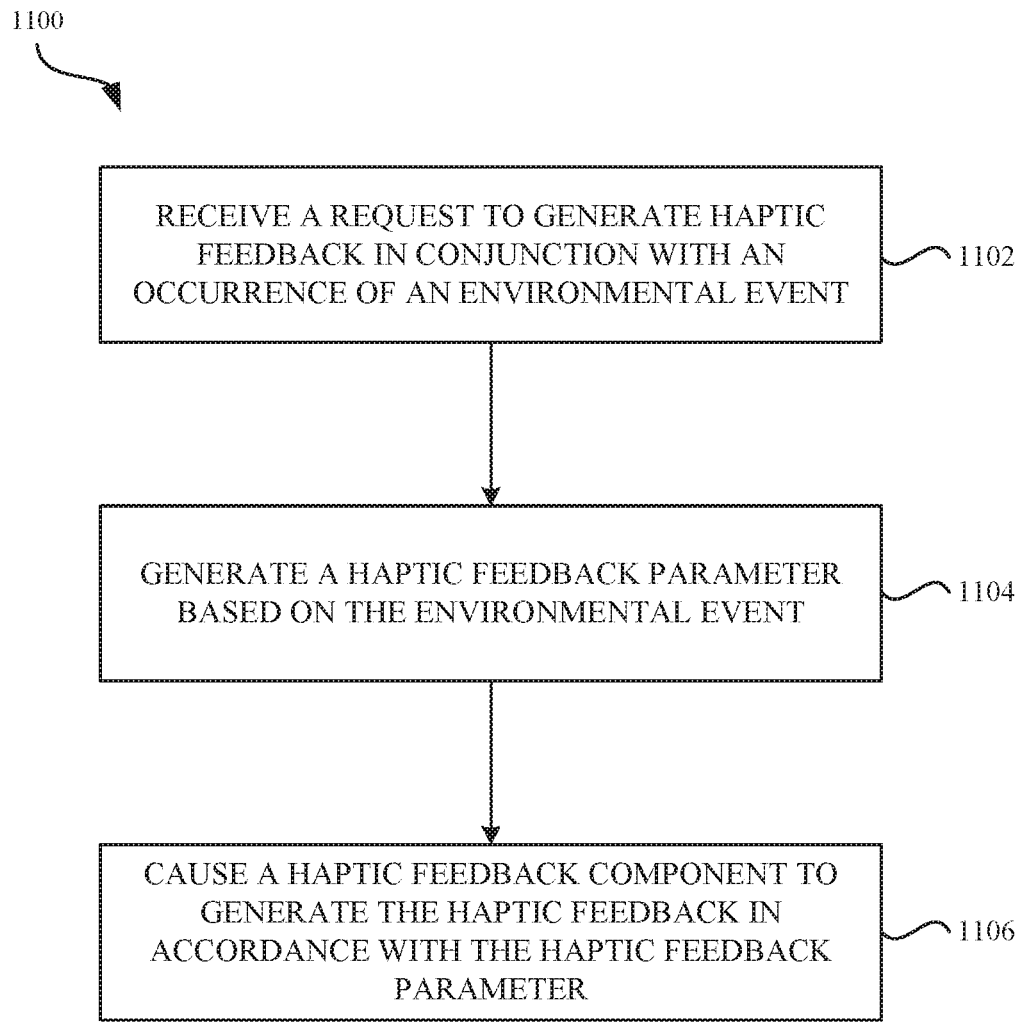
FIG. 11 illustrates a method for executing haptic feedback at a portable electronic device, in accordance with some embodiments.

FIG. 11 illustrates a method 1100 for executing haptic feedback at a portable electronic device—e.g., the portable electronic device 900—in conjunction with a device-initiated request, in accordance with some embodiments. The method 1100 begins at step 1102, where the processor 910 receives a request to generate haptic feedback in conjunction with the occurrence of an environmental event. In some examples, the environmental event can refer to a notification or indication that is received by the portable electronic device 900. In conjunction with the occurrence of the environmental event, the processor 910 can be configured to generate a haptic feedback parameter based on the environmental event at step 1104.

In some examples, the portable electronic device 900 includes a memory 920 that is capable of learning to associate a type of haptic feedback parameter with a specific type of environmental event. Subsequently, any reoccurrence of the specific type of environmental event can cause the memory 920 to provide the processor 910 with the type of haptic feedback parameter.

At step 1106, the processor can cause the power supply 930 to transmit power (e.g., electrical current) to the haptic feedback component 950 that is based on the haptic feedback parameter, which can cause the haptic feedback component 950 to generate haptic feedback. In this manner, the portable electronic device 900 is configured to generate haptic feedback in conjunction with the occurrence of the device-initiated request.

Figure 12:
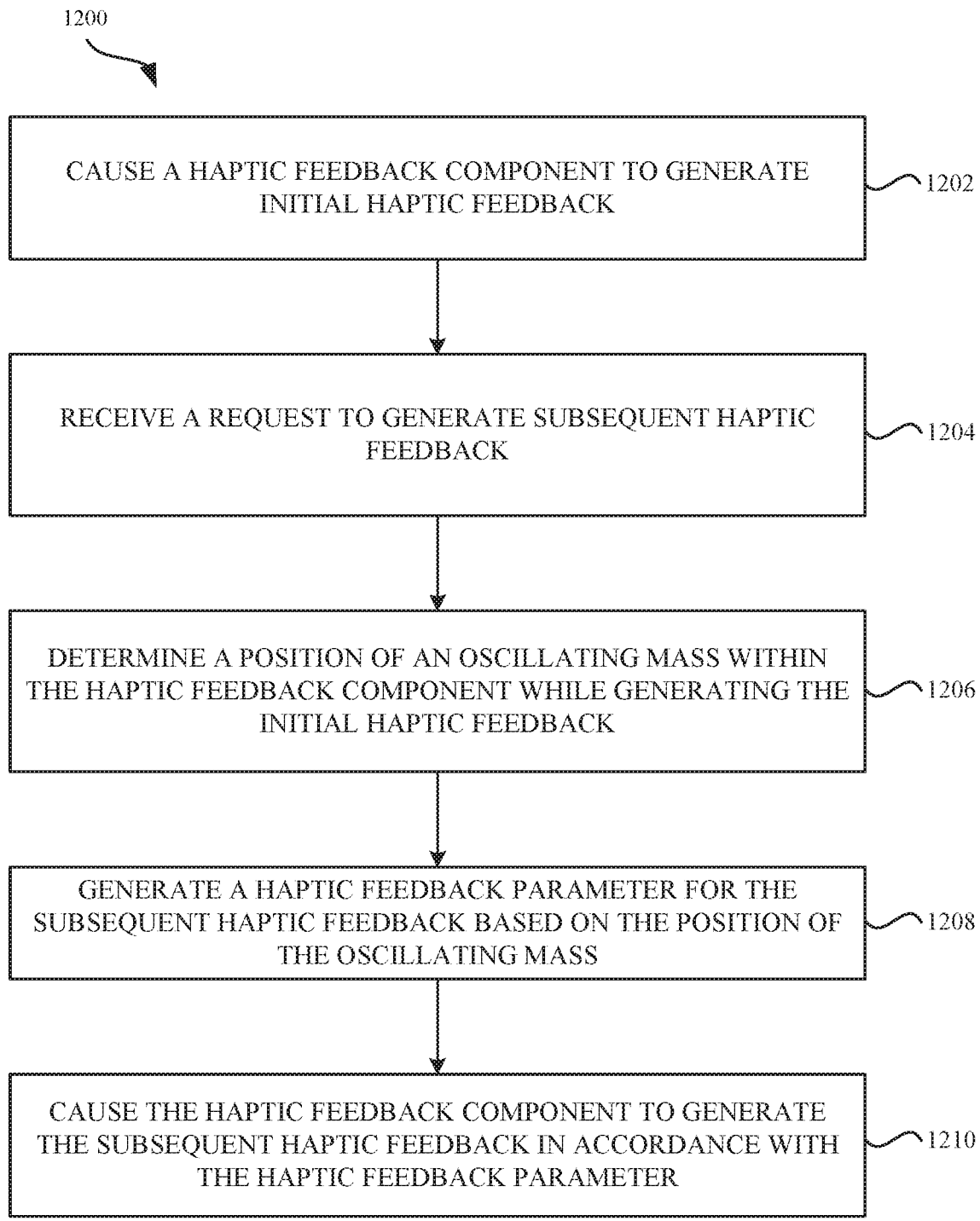
FIG. 12 illustrates a method for executing haptic feedback at a portable electronic device, in accordance with some embodiments.

FIG. 12 illustrates a method 1200 for executing an initial haptic feedback event and a subsequent haptic feedback event, in accordance with some embodiments. In some examples, the method 1200 refers to an exemplary scenario where while the haptic feedback component 950 is generating an initial haptic feedback event, the processor 910 receives a request to generate a subsequent haptic feedback event. In another example, the processor 910 can concurrently receive multiple requests to generate haptic feedback events, where the processor 910 can determine an order of executing these haptic feedback events based on the respective priority of each of the requests.

At step 1202, the processor 910 can cause the haptic feedback component 950 to generate an initial haptic feedback event. In some embodiments, the initial haptic feedback event is generated in conjunction with a user-initiated request or a device-initiated request. For example, the device-initiated request can refer to an occurrence of an initial environmental event such as a calendar alert or an incoming phone call. Next, at step 1204, in conjunction with the haptic feedback component 950 is generating the initial haptic feedback event, the processor 910 can receive a request to generate a subsequent haptic feedback event.

At step 1206, the processor 910 can determine a position of a mass 820 of the haptic feedback component 950 in conjunction with the haptic feedback component 950 generating the initial haptic feedback event. In some cases, the processor 910 can determine the position of the mass 820 based on an amount of the magnetic stray flux that is associated with the one or more permanent magnetic elements 830 of the haptic feedback component 950.

At step 1208, the processor 910 can generate a haptic feedback parameter for the subsequent haptic feedback event in accordance with the position of the mass 820. In some examples, the haptic feedback parameter is characterized by at least one of e.g., amplitude, frequency, voltage, pulse, or polarity that is associated with the request. For example, a haptic feedback parameter associated with a phone call may be greater in frequency or amplitude than a haptic feedback parameter associated with a calendar alert.

At step 1210, the processor 910 can cause the haptic feedback component 950 to generate the subsequent haptic feedback event in accordance with the adjusted haptic feedback parameter. By determining the position of the mass 820, the haptic feedback component 950 can readily and accurately adjust at least one of a position, velocity, orientation, or acceleration of the mass 820 to readily accommodate for the subsequent haptic feedback event to be generated. In one example, the processor 910 can be configured to immediately interrupt or prevent the haptic feedback component 950 from further generating the initial haptic feedback event in order to accommodate the subsequent haptic feedback event. In another example, the processor 910 can be configured to allow the initial haptic feedback event to complete its execution before providing instructions to cause the subsequent haptic feedback event to be generated.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device for executing a haptic feedback event, the electronic device comprising:
    an enclosure at least partially defining a cavity;
    a processor disposed in the cavity; and
    a haptic feedback system disposed in the cavity comprising:
        a translatable mass;
        a variable magnetic field generator in communication with the processor and defining a recess, a magnetic field generated by the variable magnetic field generator causing a translation of the mass; and
        a magnetic field sensor disposed in the recess and spaced apart from an axis of translation of the mass, the magnetic field sensor providing a detection signal to the processor that corresponds to a position of the mass during the haptic feedback event.

2. The electronic device of claim 1, wherein the processor is capable of receiving another haptic feedback request while the mass is being translated in conjunction with executing the haptic feedback event.

3. The electronic device of claim 2, wherein the haptic feedback system is capable of executing a subsequent haptic feedback event that is based on the position of the mass detected by the magnetic field sensor.

4. The electronic device of claim 1, wherein a maximum value of a change in the magnetic field detected by the magnetic field sensor provides a detection signal to the processor corresponding to the position of the mass being in closest proximity to the magnetic field sensor.

5. The electronic device of claim 4, wherein when the position of the mass is in closest proximity to the magnetic field sensor, the maximum value of the change in the magnetic field detected by the magnetic field sensor satisfies a magnetic field threshold value.

6. The electronic device of claim 1, wherein the mass is coupled to a magnetic element included in a retaining structure of the haptic feedback system, and the mass and magnetic element are translatable along a longitudinal axis of the retaining structure.

7. A method for executing multiple haptic feedback events by a haptic feedback system of an electronic device, the haptic feedback system including a translatable mass, a variable magnetic field generator defining a recess, and a magnetic field sensor disposed in the recess, the method comprising:
   executing the first haptic feedback event in response to receiving an initial request to execute a haptic feedback event by causing the variable magnetic field generator to generate a magnetic field that translates the mass by a predetermined amount based on conditions of the initial request;
   receiving a subsequent request to execute a second haptic feedback event while executing the first haptic feedback event;
   determining a position of the mass relative to the variable magnetic field generator by the magnetic field sensor while the mass is being displaced; and
   generating a feedback parameter for the second haptic feedback event that is based on the determined position of the mass.

8. The method of claim 7, further comprising:
   executing the second haptic feedback event.

9. The method of claim 8, wherein, prior to executing the second haptic feedback event, the haptic feedback system prevents the first haptic feedback event from being fully executed.

10. The method of claim 7, wherein the feedback parameter includes at least one of an acceleration of the mass, a frequency of the second haptic feedback event, and a waveform shape of the second haptic feedback event.

11. The method of claim 7, wherein the initial request is a device-initiated request, and the subsequent request is a user-initiated request.

12. An electronic device for generating haptic feedback, comprising:
   a housing at least partially defining a cavity
   a processor disposed in the cavity; and
   a haptic feedback system disposed in the cavity comprising:
      a retaining structure coupled to the housing;
      a displaceable mass that having a first end and a second end;
      a variable magnetic field generator in communication with the processor and defining a recess, a magnetic field generated by the variable magnetic field generator causing the mass to displace along a longitudinal axis of the retaining structure;
      a sensor disposed in the recess, the sensor providing a detection signal to the processor that corresponds to a position of the mass;
      a first set of springs coupled to the first end of the mass and a second set of springs couples do the second end of the mass, the first and second sets of springs preventing the mass from oscillating in a direction other than the longitudinal axis.

13. The electronic device of claim 12, wherein the first end of the mass includes a first corner and a second corner opposite the first corner, and a first spring of the first set of springs is coupled to the first corner and a second spring of the first set of springs is coupled to the second corner.

14. The electronic device of claim 12, wherein the haptic feedback system further comprises a magnetic dampening fluid dispersed around the mass, the magnetic dampening fluid capable of minimizing any noise caused by displacing the mass.

15. The electronic device of claim 12, wherein the housing includes a first mounting tab and a second mounting tab that are coupled to the haptic feedback system, and any force associated with displacing the mass is translated to the housing via the first and second mounting tabs.

16. The electronic device of claim 12, wherein the sensor is a magnetic field sensor capable of detecting a change in a magnetic field that corresponds to the position of the mass.

17. The electronic device of claim 12, wherein the sensor is an ambient light sensor, and the mass comprises a reflective component.

* * * * *